(12) United States Patent
Kim

(10) Patent No.: US 8,030,981 B2
(45) Date of Patent: Oct. 4, 2011

(54) LATENCY SIGNAL GENERATING CIRCUIT AND SEMCONDUCTOR DEVICE HAVING THE SAME

(75) Inventor: Kyung-Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 118 days.

(21) Appl. No.: 12/486,320

(22) Filed: Jun. 17, 2009

(65) Prior Publication Data

US 2010/0164572 A1    Jul. 1, 2010

(30) Foreign Application Priority Data

Dec. 30, 2008 (KR) .................. 10-2008-0137382

(51) Int. Cl.
*H03H 11/26* (2006.01)

(52) U.S. Cl. ......... 327/284; 327/161; 327/164; 365/194

(58) Field of Classification Search .................. 327/161, 327/164, 284; 365/194
See application file for complete search history.

(56) References Cited

U.S. PATENT DOCUMENTS

| 6,509,776 | B2 * | 1/2003 | Kobayashi et al. | ........... 327/277 |
| 7,038,972 | B2 | 5/2006 | Seo et al. | |
| 7,170,819 | B2 | 1/2007 | Szczypinski | |
| 2008/0192563 | A1 | 8/2008 | Cho | |
| 2009/0040847 | A1 | 2/2009 | Lee | |
| 2009/0116313 | A1 | 5/2009 | Jang | |

FOREIGN PATENT DOCUMENTS

| KR | 1020050074247 | 7/2005 |
| KR | 1020080074361 | 8/2008 |
| KR | 100931026 | 12/2009 |

OTHER PUBLICATIONS

Notice of Allowance issued from Korean Intellectual Property Office on Aug. 31, 2010.

* cited by examiner

*Primary Examiner* — Lincoln Donovan
*Assistant Examiner* — John Poos
(74) *Attorney, Agent, or Firm* — IP & T Group LLP

(57) ABSTRACT

A semiconductor device includes a latency signal generating circuit for generating a latency signal corresponding CAS latency by measuring a delay amount reflected at a delay locked loop and reflecting the measured delay amount at a read command signal, and a delay locked loop for controlling an internal clock signal applied to the latency signal generating circuit corresponding to the read command and the latency signal. The semiconductor device includes an internal clock signal generating block configured to generate an internal clock signal, a latency generating block configured to generate a latency signal by synchronizing a read command signal with the internal clock signal at a time corresponding to a CAS latency value and a measured delay value, and an input controlling block configured to activate the reference clock signal using an external clock signal in response to the read command signal and the latency signal.

40 Claims, 16 Drawing Sheets

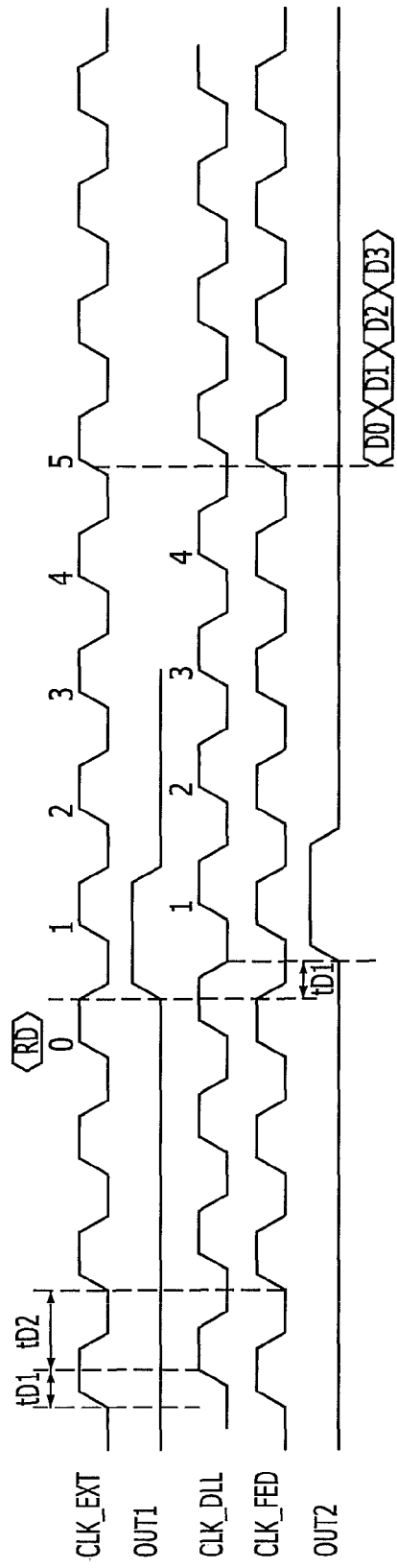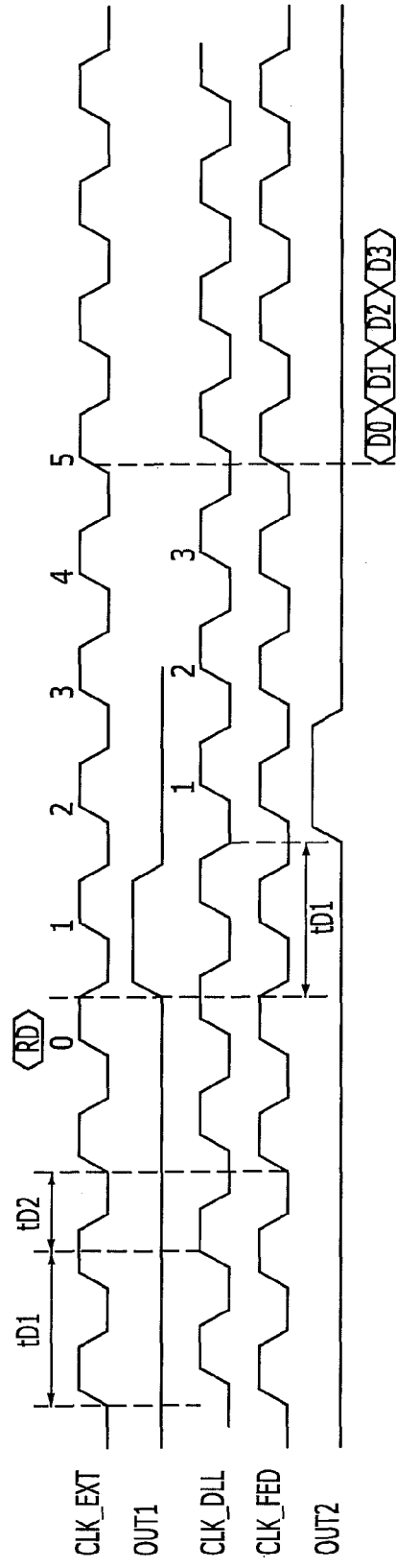

LATENCY SIGNAL GENERATING CIRCUIT AND SEMCONDUCTOR DEVICE HAVING THE SAME

CROSS-REFERENCE TO RELATED APPLICATIONS

The present invention claims priority of Korean patent application number 10-2008-0137382, filed on Dec. 30, 2008, the disclosure of which is incorporated herein by reference in its entirety.

BACKGROUND OF THE INVENTION

The present invention relates to semiconductor design, and more particularly, to a latency signal generating circuit for outputting a latency signal by synchronizing a read command signal, which is synchronized with an external clock signal, with an internal clock signal, and an internal clock signal generating circuit for outputting an internal clock signal by compensating an received external clock signal for an internal delay time of a semiconductor device.

In general, a semiconductor device such as a Double Data Rate Synchronous DRAM (DDR SDRAM) receives an external clock signal, generates an internal clock signal based on the received external clock signal, and uses the generated internal clock signal as a reference to synchronize various operation timings in a semiconductor device. Accordingly, the semiconductor device includes an internal clock signal generating circuit for generating an internal clock signal. Since a skew is generally generated between an external clock signal and an internal clock signal due to an internal delay of a semiconductor device, the internal clock signal generating circuit receives an external clock signal, compensates the external clock signal for the internal delay, and outputs the compensated external clock signal as an internal clock signal. A phase locked loop (PLL) or a delay locked loop (DLL) are representative internal clock signal generating circuits.

A semiconductor device receives a read command that is synchronized with an external clock signal and outputs stored data to an external device in response to an internal clock signal. That is, a semiconductor device uses an internal clock signal, not an external clock signal, to output data. Therefore, in a read operation, a semiconductor device needs to synchronize a read command, which is synchronized with an external clock signal, with an internal clock signal. That is, the synchronized clock signal is changed from an external clock signal to an internal clock signal based on the read command. Changing a synchronization target signal from a clock signal to another clock signal is referred to as domain crossing.

A semiconductor device includes various circuits for performing the domain crossing operation. Such circuits for the domain crossing include a latency generating circuit. The latency generating circuit synchronizes a read command, which was synchronized with an external clock signal, with an internal clock signal and outputs the synchronized signal as a latency signal. Herein, the latency signal, wherein the domain crossing is completed, includes CAS latency (CL) information. The semiconductor device uses the latency signal to output data to be synchronized with an external clock signal at desired point after a corresponding read command. Herein, the CAS latency includes time information from a time point of applying a corresponding read command to a time point of outputting data using one cycle of an external clock signal as a unit time. In general, the CAS latency is stored in a mode register set included in a semiconductor device.

FIG. 1 is a block diagram illustrating a delay locked loop (DLL) which is an internal clock signal generating circuit according to a prior art.

Referring to FIG. 1, the delay locked loop includes a phase comparator 110, a control signal generator 130, a variable delay unit 150, and a delay replica model 170.

The phase comparator 110 compares an external clock signal CLK_EXT with a feedback clock signal CLK_FED and outputs a detection signal DET. For example, if a phase of the feedback clock signal CLK_FED lags behind that of the external clock signal CLK_EXT, the detection signal DET becomes logic high. If a phase of the feedback clock signal CLK_FED is ahead of that of the external clock signal CLK_EXT, the detection signal DET becomes logic low.

The control signal generator 130 generates delay control signals CTR_DLY in response to the detection signal. Herein, the control signal generator 130 generates n delay control signals CTR_DLY corresponding to the number of unit delay cells included in the variable delay unit 150 where n is an integer number.

The variable delay unit 150 outputs a DLL clock signal CLK_DLL by delaying an external clock signal CLK_EXT according to the delay control signals CTR_DLY. The variable delay unit 150 includes a plurality of unit delay cells and each of the unit delay cells is enabled in response to a corresponding delay control signal CTR_DLY. Therefore, a delay amount of the external clock signal CLK_EXT is decided according to the number of enabled unit delay cells.

The delay replica model 170 generates a feedback clock signal CLK_FED by mirroring (for example, substantially identically) an internal delay of the semiconductor device to the DLL clock signal CLK_DLL outputted from the variable delay unit 150. In general, the delay replica model 170 is formed identically to a circuit of a path transferring the DLL clock signal CLK_DLL inside the semiconductor device.

The delay locked loop performs operations for making the external clock signal CLK_EXT and the feedback clock signal CLK_FED to have the same phase. Herein, making the external clock signal CLK_EXT and the feedback clock signal CLK_FED to have the same phase is referred to as locking. The locked DLL clock signal CLK_DLL is used to synchronize data. Accordingly, the data outputted after being synchronized with the DLL clock signal CLK_DLL is equivalent to data outputted after being synchronized with the external clock signal CLK_DLL.

FIG. 2 is a block diagram illustrating a latency signal generating circuit according to the prior art.

Referring to FIG. 2, the latency signal generating circuit includes a counter reset signal generator 210, an initializing unit 220, a DLL clock counter 230, an OE delay replica model 240, an external clock counter 250, a counter value latch unit 260, and a counting value comparator 270.

The counter reset signal generator 210 generates a DLL clock counter reset signal RSTb_DLL for resetting the DLL clock counter 230 by synchronizing the latency reset signal RSTb with the DLL clock signal CLK_DLL. The latency reset signal RSTb is activated by decoding external command signals such as a chip select signal /CS, a row address strobe signal /RAS, a column address strobe signal /CAS, and a write enable signal /WE. Or, the latency reset signal RSTB is activated at a time of ending a locking operation of the delay locked loop (see FIG. 1).

The initializing unit 220 provides an initial counting value INT<0:2> corresponding to CAS latency CL to the DLL clock counting unit 230. Herein, it is embodied that the initial counting unit value INT<0:2> is a 3-bit code signal. The following Table 1 shows initial counting setup values set in the initializing unit 220 corresponding to CAS latency CL3 and CAS latency CL6 and initial counting values INT<0:2> outputted from the initializing unit 220 corresponding to the initial counting setup values.

TABLE 1

| CL | Initial counting setup value | INT<2> | INT<1> | INT<0> |
|---|---|---|---|---|
| 3 | 5 | 1 | 0 | 1 |
| 4 | 4 | 1 | 0 | 0 |
| 5 | 3 | 0 | 1 | 1 |
| 6 | 2 | 0 | 1 | 0 |

The DLL clock counter 230 is reset in response to the DLL clock counter reset signal RSTb_DLL and counts the DLL clock signal CLK_DLL from the initial counting value INT<0:2> outputted from the initializing unit 220. That is, the DLL clock counting unit 230 generates a DLL clock counting value CNT_DLL<0:2> by counting the DLL clock signal CLK_DLL from an initial counting value set according to the CAS latency CL. For example, if the initial counting value INT<0:2> is set to 4 according to CAS latency CL, the DLL clock counter 230 outputs the DLL clock counting value CNT_DLL<0:2> counted from 4 in response to the DLL clock signal CLK_DLL.

The OE delay replica model 240 models a delay amount between the DLL clock signal CLK_DLL and the external clock signal CLK_EXT. That is, the OE delay replica model 240 generates an external clock counter reset signal RSTb_EXT by delaying the DLL clock counter reset signal RSTb_DLL. Herein, the external clock counter reset signal RSTb_EXT is synchronized with the external clock signal CLK_EXT.

The external clock counter 250 performs a counting operation in response to the external clock counter reset signal RSTb_EXT. That is, the external clock counter 250 outputs an external clock counting value CNT_EXT<0:2> counted in response to an external clock signal CLK_EXT according to the external clock counter reset signal RSTb_EXT. The initial counting value of the external clock counter 250 is set to 0 unlike the DLL clock counter 230. In other words, the external clock counter 250 outputs an external clock counting value CNT_EXT<0:2> counted from 0 in response to the external clock signal CLK_EXT after enabled according to the external clock counter reset signal RSTb_EXT.

The counting value latch unit 260 latches the external clock counting value CNT_EXT<0:2> in response to a read command signal RD_EN and outputs the latched external clock counting value LAT_CNT<0:2>. The read command signal RD_EN is a pulse signal that is activated in response to a read command. Herein, the read command is applied after being synchronized with the external clock signal CLK_EXT.

The counting value comparator 270 compares the DLL clock counting value CNT_DLL<0:2> with the latched external clock counting value LAT_CONT<0:2> and outputs a latency signal LTC activated at a time when the two values become identical. The latency signal LTC is synchronized with the DLL clock signal CLK_DLL and includes CAS latency information. In other words, the latency signal LTC is a signal generated by synchronizing a read command, which is applied after being synchronized with an external clock signal CLK_EXT, with a DLL clock signal CLK_DLL wherein CAS latency is reflected. That is, the latency signal LTC is a result of domain crossing of the read command. The latency signal LTC is used to output data with burst length information in later.

FIG. 3 is a waveform for describing an operation timing of a latency signal generating circuit of FIG. 2. For illustration purposes, CL4 indicates when CAS latency CL is 4, CL5 indicates when CAS latency CL is 5, and CL6 indicates when CAS latency CL is 6.

At first, an operation timing of a latency signal generating circuit of FIG. 2 when CAS latency CL is 4 will be described.

The initial counting value of the initializing unit 220 is set to 4 according to Table 1. Then, when a DLL clock counter reset signal RSTb_DLL is shifted to logic high, the DLL clock counting unit 230 outputs a DLL clock counting value CNT_DLL<0:2> counted from 4 which is an initial counting value in response to the DLL clock signal CLK_DLL.

Meanwhile, the OE delay replica model 240 outputs an external clock counter reset value RSTb_EXT by mirroring a delay time D to the DLL clock counter reset signal RSTb_DLL. Then, when the external clock counter reset signal RSTb_EXT is shifted to logic high, the external clock counter 250 outputs an external clock counting value CNT_EXT<0:2> counted from 0 in response to the external clock signal CLK_EXT.

If the read command signal RD_EN is activated because the read command RD is applied, the counting value latch unit 260 outputs 3 which is an external clock counting value CNT_EXT<0:2> as the latched external clock counting value LAT_CNT<0:2>. The counting value comparator 270 compares the DLL clock counting value CNT_DLL<0:2> with the latched external clock counting value LAT_CNT<0:2> and activates the latency signal LTC when the two values become identical, that is, when the DLL clock counting value CNT_DLL<0:2> becomes 3. A semiconductor device outputs data using the activated latency signal LTC when the external clock signal CLK_EXT becomes 4.

In case of CL5, the latency signal LCT is activated when the DLL clock signal CLK_DLL is 4. A semiconductor device outputs data using the activated latency signal LCT when the external clock signal CLK_EXT becomes 5. In case of CL6, the latency signal LCT is activated when the DLL clock signal CLK_DLL becomes 5. A semiconductor device outputs data using the activated latency signal LTC when the external clock signal CLK_EXT becomes 6.

Meanwhile, semiconductor devices are being manufactured for high speed operation, low power consumption, and miniaturization. However, such a semiconductor device may have the following problems.

At first, the increment of an operation frequency of a semiconductor device causes increasing CAS latency CL. Since the counting circuit having the DLL clock counter 230 and the external clock counter 250 is designed corresponding to CAS latency CL, it is necessary to design the counter circuit big if the CAS latency CL becomes large. Furthermore, it is also necessary to design a comparing circuit of the counting value comparator 270 big according to the counter. That is, a chip size of a semiconductor device disadvantageously increases.

Also, since a 4-bit counter circuit has a slower operation speed than that of a 3-bit counter circuit, the operation speed of the counter circuit become slow as the CAS latency CL increases. Then, an operation speed of the comparing circuit becomes slow as the number of bits increases. That is, a data processing speed of a semiconductor device becomes slow.

A latency signal generating circuit according to the prior art latches an external clock counting value CNT_EXT<0:2> when a read command signal RD_EN is activated. Therefore, the DLL clock counter 230 and the external clock counter 250 perform a reset operation and a counting operation before the read command signal RD_EN is activated. That is, before the read command signal RD_EN is activated, the external clock counter 250 receiving the external clock signal CLK_EXT and the DLL clock counter 230 receiving the DLL clock signal CLK_DLL continuously perform counting operations. It means a semiconductor device may waste power until the read command RD is applied. In this view, the delay locked loop DLL circuit may continuously generate the DLL clock signal CLK_DLL for the smooth operation of the latency signal generating circuit. Thus, the delay locked loop DLL circuit may waste power continuously.

SUMMARY OF THE INVENTION

Embodiments of the present invention are directed to providing a semiconductor device including a latency signal generating circuit for generating a latency signal corresponding CAS latency by measuring a delay amount reflected at a delay locked loop and reflecting the measured delay amount at a read command signal, and a delay locked loop for controlling an internal clock signal applied to the latency signal generating circuit corresponding to the read command and the latency signal.

Embodiments of the present invention are directed to providing a method for measuring a delay amount of a delay locked loop, and generating a latency signal by reflecting the measured delay amount at a read command in a normal mode.

In accordance with an aspect of the present invention, there is provided a semiconductor device, which includes an internal clock signal generating block configured to generate a delay control signal by detecting a phase difference between a reference clock signal and a feedback clock signal, generate an internal clock signal by delaying the reference clock signal for a time corresponding to the delay control signal, and generate the feedback clock signal by reflecting delay of a clock path in the semiconductor device at the internal clock signal, a latency generating block configured to generate a latency signal by synchronizing a read command signal with the internal clock signal at a time corresponding to a CAS latency value and a measured delay value calculated based on a delay amount between the reference clock signal and the feedback clock signal in response to locking completion information, and an input controlling block configured to activate the reference clock signal using an external clock signal in response to the read command signal and the latency signal.

The semiconductor device according to the present invention measures the degree of the delay reflected at a delay locked loop when the delay locked loop completes a locking operation and generates a latency signal corresponding to CAS latency by reflecting the measured delay at a read command signal. Particularly, a latency signal generating circuit according to the present invention sets up a latency signal corresponding to CAS latency before a read command is received unlike a conventional latency signal generating circuit.

Conventionally, it is required to modify the design of a counter circuit and a comparator circuit according to CAS latency. It caused many problems. However, the latency signal generating circuit according to the present invention can generate a latency signal corresponding CAS latency without designing a counter circuit and a comparator circuit. Therefore, the latency signal generating circuit according to the present invention is suitable to a development direction of a semiconductor device for high speed operation, low power consumption, and miniaturization. Also, the delay locked loop according to the present invention is enabled for desired periods. Therefore, it is possible to minimize power consumption for generating a DLL clock signal.

BRIEF DESCRIPTION OF THE DRAWINGS

FIGS. 12A and 12B are waveforms showing an operation of a latency signal generating circuit in accordance with an embodiment of the present invention.

DESCRIPTION OF SPECIFIC EMBODIMENTS

Hereinafter, a register controlled Delay Locked Loop (DLL) circuit in accordance with the present invention will be described in detail with reference to the accompanying drawings.

Figure 1:
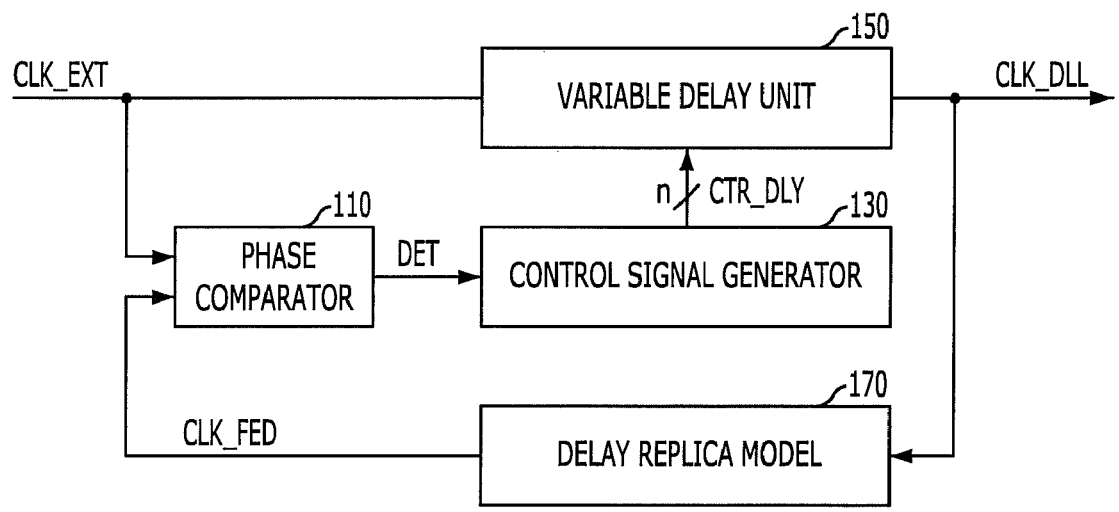
FIG. 1 is a block diagram illustrating a delay locked loop DLL which is an internal clock signal generating circuit according to the prior art.
Figure 2:
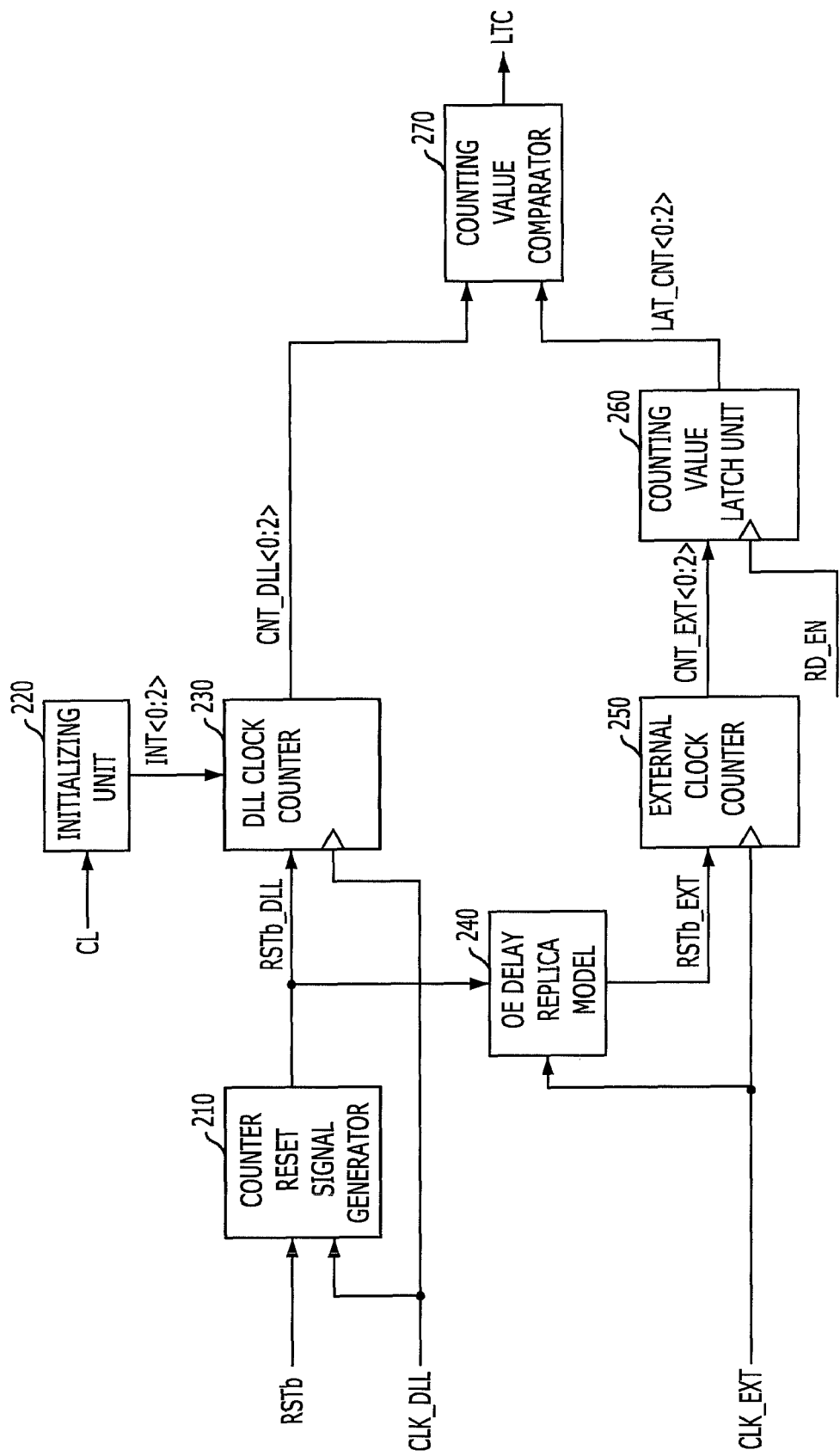
FIG. 2 is a block diagram illustrating a latency signal generating circuit according to the prior art.
Figure 3:
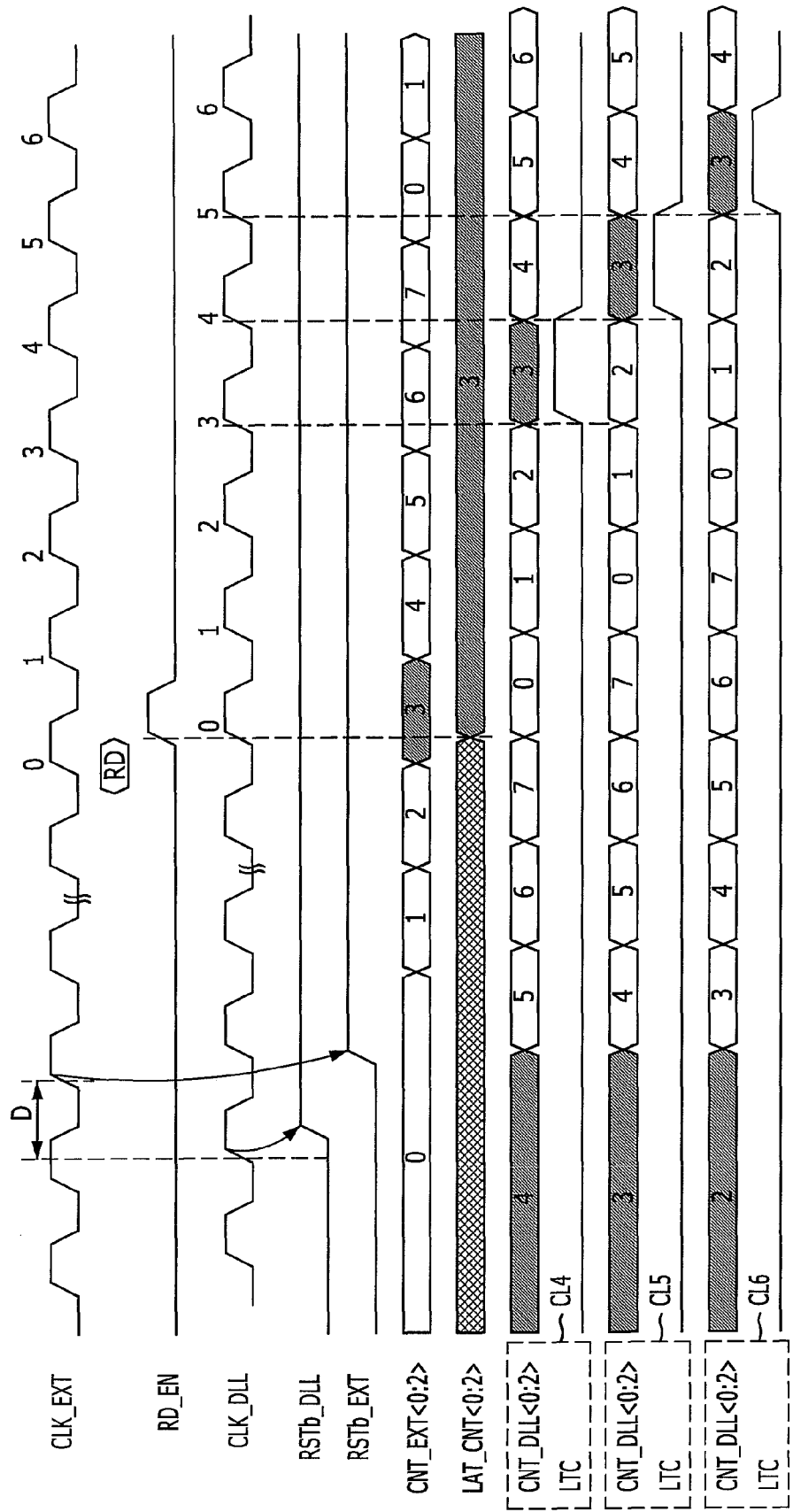
FIG. 3 is a waveform showing an operation timing of a latency signal generating circuit of FIG. 2.
Figure 4:
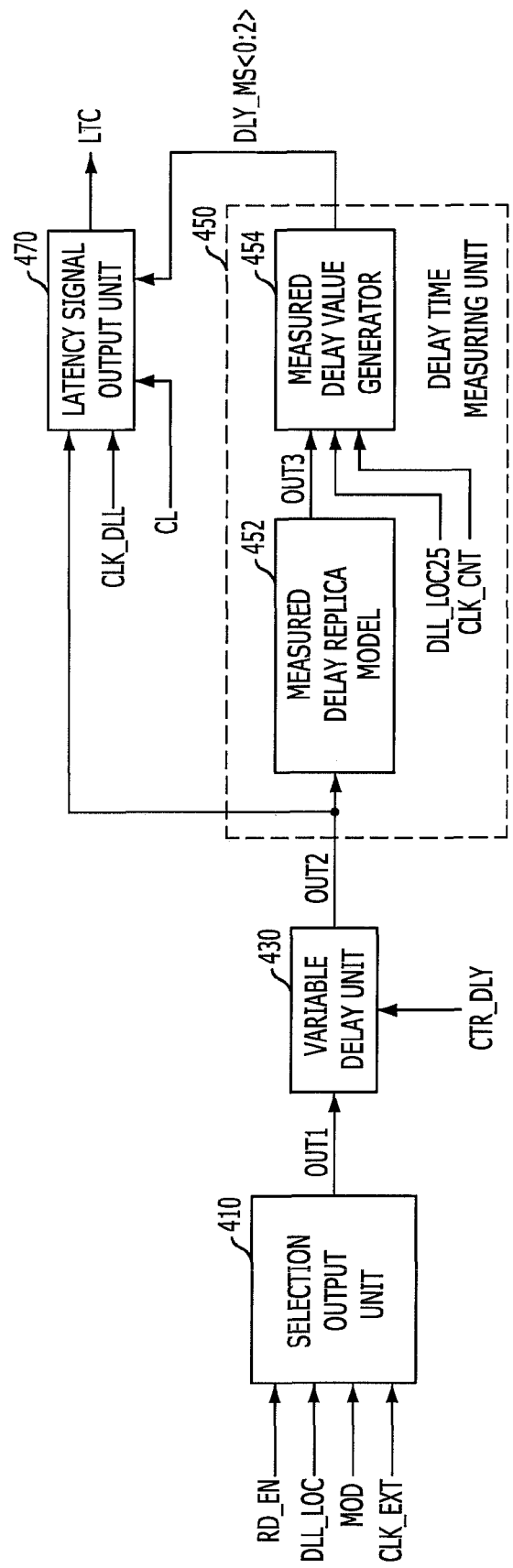
FIG. 4 is a block diagram illustrating a latency signal generating circuit of a semiconductor device in accordance with an embodiment of the present invention.

FIG. 4 is a block diagram illustrating a latency signal generating circuit of a semiconductor device in accordance with an embodiment of the present invention.

Referring to FIG. 4, the latency signal generating circuit according to the present embodiment calculates a measured delay value DLY_MS<0:2> representing a delay amount between a reference clock signal CLK_REF (see FIG. 13) and a feedback clock signal CLK_FED (see FIG. 13) in response to a locking completion signal DLL_LOC synchronized with an external clock signal CLK_EXT and generates a latency signal LTC by synchronizing a read command signal RD_EN15, which was synchronized with an external clock signal CLK_EXT, with the DLL clock signal CLK_DLL. The latency signal generating circuit according to the present embodiment includes a selection output unit 410, a variable delay unit 430, a delay time measuring unit 450, and a latency signal output unit 470.

The selection output unit 410 selectively output the read command signal RD_EN and the locking completion signal DLL_LOC according to a normal mode or a delay measurement mode by synchronizing the read command signal RD_EN and the locking completion signal DLL_LOC with the external clock signal CLK_EXT. The delay measurement mode indicates a mode for generating a measured delay value DLY_MS<0:2> by measuring the degree of the delay reflected in the delay locked loop (DLL) and selecting a corresponding latency signal LTC before a read command is applied after locking of the DLL. The normal mode denotes a mode wherein a read operation can be performed in response to the read command after locking of the DLL. A mode selection signal MOD can be used for selecting one of the normal mode and the delay measurement mode. The locking completion signal DLL_LOC is a signal activated when the DLL completes the locking. The locking completion signal DLL_LOC and the mode selection signal MOD may have a logical level value.

Figure 5:
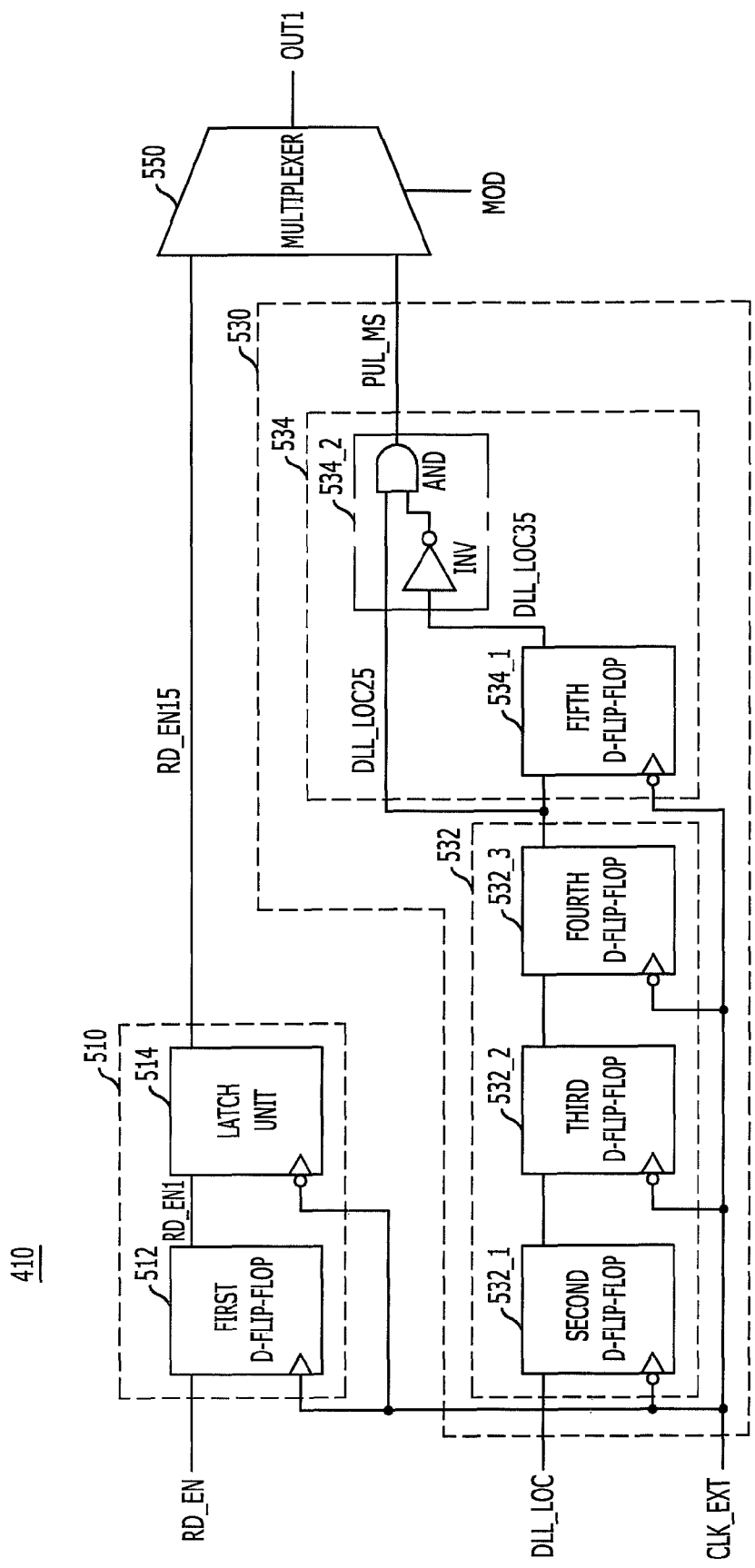
FIG. 5 is a diagram illustrating a selection output unit 410 of FIG. 4.

FIG. 5 is a diagram illustrating a selection output unit 410 of FIG. 4.

Referring to FIG. 5, the selection output unit 410 may include a read command signal synchronizer 510, a locking completion signal synchronizer 530, and a multiplexer 550.

The read command signal synchronizer 510 outputs a synchronized read command signal RD_EN15 by synchronizing the read command signal RD_EN with an external clock signal CLK_EXT in the normal mode. The read command signal synchronizer 510 may include a first D-flip-flop 512 and a latch unit 514.

Figure 6:
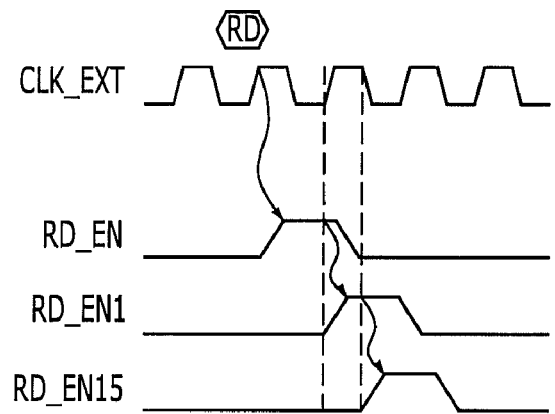
FIG. 6 is a waveform showing an operation timing of a read command signal synchronizer 510 of FIG. 5.

Herein, the first D-flip-flop 512 synchronizes the read command signal RD_EN with the external clock signal CLK_EXT and outputs the synchronized read command signal and may be designed as a D-flip-flop circuit (DFF) that operates in response to a clock signal. The latch unit 514 receives an output signal of the first D-flip-flop 512 and outputs a synchronized read command signal RD_EN15 in response to the external clock signal CLK_EXT. The latch unit 514 may be designed as a latch circuit operating in response to a clock signal. Since the synchronized read command signal RD_EN15 is synchronized with a rising edge of a DLL clock signal CLK_DLL in the latency signal output unit 470 through the variable delay unit 430 of FIG. 4 in the normal mode, it is preferable that the latch unit 514 outputs the output signal RD_EN1 of the first D-flip-flop 512 in synchronization with a falling edge of the external clock signal CLK_EXT FIG. 6 is a waveform for describing an operation timing of a read command signal synchronizer 510 of FIG. 5. FIG. 6 shows an external clock signal CLK_EXT, a read command signal RD_EN, an output signal RD_EN1 of a first D-flip-flop 512, and a synchronized read command signal RD_EN15.

Hereinafter, the operation of the read command signal synchronizer 510 will be described with reference to FIGS. 5 and 6.

When a read command RD is applied in synchronization with the external clock signal CLK_EXT, the read command signal RD_EN is activated. The first D-flip-flop 512 synchronizes the read command signal RD_EN in response to a rising edge of the external clock signal CLK_EXT. The latch unit 514 synchronizes the output signal RD_EN1 of the first D-flip-flop 512 with a falling edge of the external clock signal CLK_EXT and outputs the synchronized signal as the synchronized read command signal RD_EN15. The read command signal synchronizer 510 may have a structure for stably synchronizing the read command signal RD_EN with the external clock signal CLK_EXT and may be modified according to design.

Referring back to FIG. 5, the locking completion signal synchronizer 530 outputs a delay measurement pulse signal PUL_MS by synchronizing the locking completion signal DLL_LOC with the external clock signal CLK_EXT in the delay measurement mode. The locking completion signal synchronizer 530 includes a synchronizer 532 and a pulse signal generator 534.

The synchronizer 532 outputs a synchronized locking completion signal DLL_LOC25 by synchronizing the locking completion signal DLL_LOC with the external clock signal CLK_EXT. The synchronizer 532 includes second to fourth D-flip-flops 532_1, 532_2, and 532_3.

The second D-flip-flop 532_1 synchronizes the locking completion signal DLL_LOC with the external clock signal CLK_EXT and outputs the synchronized signal. The third D-flip-flop 532_2 synchronizes the output signal of the second D-flip-flop 532_1 with the external clock signal CLK_EXT. The fourth D-flip-flop 532_3 synchronizes the output signal of the third D-flip-flop 532_2 with the external clock signal CLK_EXT and outputs the synchronized signal. The second to fourth D-flip-flops 532_1, 532_2, and 532_3 may be formed as a D-flip-flop circuit. The second and third D-flip-flops 532_1 and 532_2 are included for stably adjusting a setup/hold time of the locking completion signal DLL_LOC. The second and third D-flip-flops 532_1 and 532_2 may be modified or omitted according to design needs.

Meanwhile, the pulse signal generator 534 receives the synchronized locking completion signal DLL_LOC25, which is generated by synchronizing the locking completion signal DLL_LOC with the external clock signal CLK_EXT, and generates a delay measurement pulse signal PUL_MS. The pulse signal generator 534 includes a fifth D-flip-flop 534_1 and a pulse signal output unit 534_2.

The fifth D-flip-flop 534_1 synchronizes the synchronized locking completion signal DLL_LOC25 with the external clock signal CLK_EXT and outputs the synchronized signal. The fifth D-flip-flop 534_1 may be formed of a D-flip-flop circuit. The pulse signal output unit 534_2 receives the synchronized locking completion signal DLL_LOC25 and the output signal of the fifth D-flip-flop 534_1 and outputs the delay measurement pulse signal PUL_MS having a predetermined pulse width.

The pulse signal output unit 534_2 may include an inverter INV for receiving the output signal DLL_LOC35 of the fifth D-flip-flop 534_1 and an AND gate for receiving the synchronized locking completion signal DLL_LOC25 and the output signal of the inverter INV and outputting a delay measurement pulse signal PUL_MS.

The delay measurement pulse signal PUL_MS is activated in response to the synchronized locking completion signal DLL_LOC25 and inactivated in response to the output signal DLL_LOC35 of the fifth D-flip-flop 534_1. That is, the pulse width of the delay measurement pulse signal PUL_MS is decided by the synchronized locking completion signal DLL_LOC25 and the output signal DLL_LCO35 of the fifth D-flip-flop 534_1.

Figure 7:
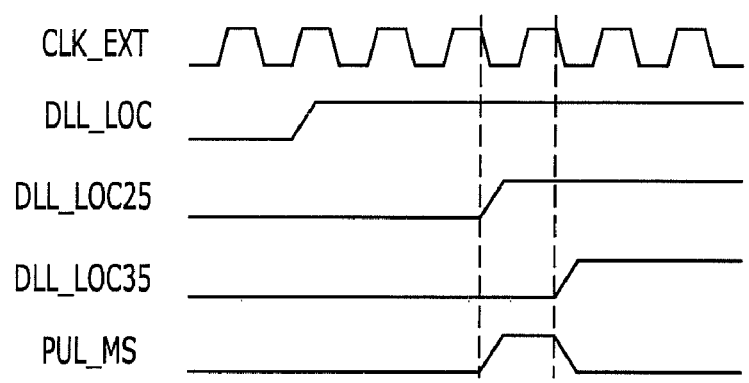
FIG. 7 is a waveform showing an operation timing of a locking completion signal synchronizer 530 of FIG. 5.

FIG. 7 is a waveform showing an operation timing of a locking completion signal synchronizer 530 of FIG. 5. FIG. 7 shows an external clock signal CLK_EXT, a locking completion signal DLL_LOC, a synchronized locking completion signal DLL_LOC25, an output signal of the fifth D-flip-flop 534_1, and a delay measurement pulse signal PUL_MS.

Hereinafter, the operation of the locking completion signal synchronizer 530 will be described with reference to FIGS. 5 and 7.

When the delay locked loop DLL completes the locking, the locking completion signal DLL_LOC is shifted from logic low to logic high. Accordingly, the synchronized locking completion signal DLL_LOC25 is activated in response to a falling edge of the external clock signal CLK_EXT. Herein, the delay measurement pulse signal PUL_MS becomes logic high in response to the synchronized locking completion signal DLL_LOC25. Then, the output signal DLL_LOC35 of the fifth D-flip-flop 534_1 is shifted in response to a falling edge of the external clock signal CLK_EXT. Herein, the delay measurement pulse signal PUL_MS becomes logic low in response to the output signal DLL_LOC35 of the fifth D-flip-flop 534_1.

Referring back to FIG. 5, the multiplexer 550 outputs one of the synchronized read command signal RD_EN15 and the delay measurement pulse signal PUL_MS according to a mode selection signal MOD. The multiplexer 550 may be formed of a multiplexer circuit. For example, if the mode selection signal MOD becomes logic low in a normal mode, the multiplexer 550 outputs the synchronized read command signal RD_EX15 as a first output signal OUT1. If the mode selection signal MOD becomes logic high in a delay measurement mode, the multiplexer 550 may output the delay measurement pulse signal PUL_MS as the first output signal OUT1.

Figure 13:
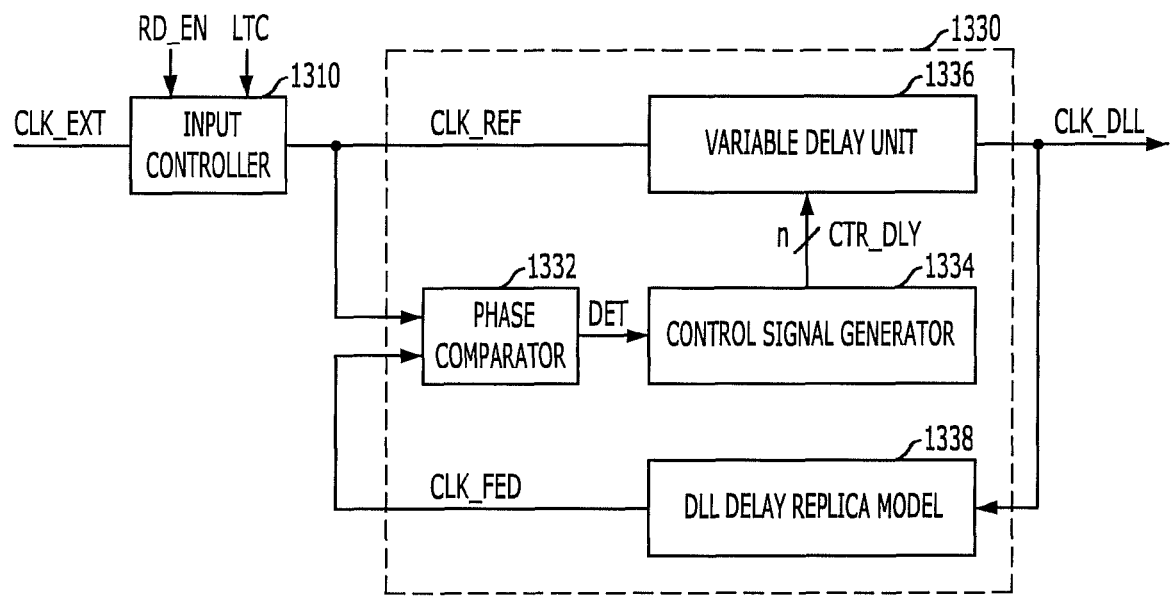
FIG. 13 is a block diagram illustrating a circuit for generating a DLL clock signal CLK_DLL.

Referring back to FIG. 4, the variable delay unit 430 delays the first output signal OUT1 of the selection output unit 410 corresponding to a delay amount between a reference clock signal CLK_REF (see FIG. 13) and the DLL clock signal CLK_DLL. The variable delay unit 430 may delay the first output signal OUT1 for a time determined by a delay control signal CTR_DLY and outputs the delayed signal as a second output signal OUT2. Herein, the variable delay unit 430 may have a similar structure of a variable delay unit 1136 of the delay locked loop DLL, which is shown in FIG. 13. Since the variable delay unit 430 of FIG. 4 and the variable delay unit 1336 of FIG. 13 perform a delay operation controlled by the same delay control signal CTR_DLY, each of input signals may be delayed for the time determined by the delay control signal CTR_DLY.

The delay time measuring unit 450 receives the second output signal OUT2 of the variable delay unit 430, measures a delay amount between a reference clock signal CLK_REF (see FIG. 13) and a feedback clock signal CLK_FED (see FIG. 13), and outputs the measured delay as a measured delay value DLY_MS<0:2>. The delay time measuring unit 450 may include a measured delay replica model 452 and a measured delay value generator 454.

The measured delay replica model 452 delays the second output signal OUT2 of the variable delay unit 430 for a delay amount between the DLL clock signal CLK_DLL and the feedback clock signal CLK_FED and outputs the delayed signal as a third output signal OUT3. Since the measured delay replica model 452 has a structure similar to a DLL delay replica model 1338 of a delay locked loop DLL of FIG. 13, the measured delay replica model 452 delays the second output signal OUT2 of the variable delay unit 430 for a delay time of a real clock/data path and outputs the delayed signal as a third output signal OUT3. The measured delay replica model 452 may receive the second output signal OUT2 of the variable delay unit 430 in a delay measurement mode. In this case, the measured delay replica model 452 may be designed to receive the second output signal OUT2 of the variable delay unit 430 only in the delay measurement mode by additionally receiving a mode selection signal MOD.

In order to describe the measured delay replica model 452 in more detail, a counting clock signal CLK_CNT inputted to the measured delay value generator 454 will be described. The counting clock signal CLK_CNT is generated based on the external clock signal CLK_EXT like the reference clock signal CLK_REF. If the counting clock signal CLK_CNT and the reference clock signal CLK_REF have the same phase, it is preferable to design the measured delay replica model 452 and the DLL delay replica model 1338 identically. However, the external clock signal CLK_EXT travels different transmission lines to a circuit of generating the counting clock signal CLK_CNT compared to that of the reference clock signal CLK_REF. As a result, a skew is generated between the two clock signals. Therefore, the measured delay replica model 452 may be designed by further reflecting ±Δ(skew of two clock signals) with a delay time of the DLL delay replica model 1338. However, the skew of the two clock signals is not discussed in this disclosure as not being necessary.

The measured delay value generator 454 counts the counting clock signal CLK_CNT in response to the third output signal OUT3 of the measured delay replica model 452 and the synchronized locking completion signal DLL_LOC25 corresponding to the locking completion signal DLL_LOC and generates the counted signal as the measured delay value DLY_MS<0:2>. Herein, the measured delay value DLY_MS<0:2> may be a 3-bit code signal. It may be modified according to design. The measured delay value DLY_MS<0:2> according to the present embodiment may have a value corresponding to a delay amount between the reference clock signal CLK_REF and the feedback clock signal CLK_FED after completing locking of the delay locked loop DLL. That is, the measured delay value DLY_MS<0:2> may have a value corresponding to a delay time of the synchronized locking completion signal DLL_LOC25 (see FIG. 5) by passing through the variable delay unit 430 and the measured delay replica model 452 in the delay measurement mode. In other words, since the variable delay unit 430 reflects the same delay time of the variable delay unit 1336 of FIG. 13 and the measured delay replica model 452 reflects the same delay time of the DLL delay replica model 1338 of FIG. 13, the measured delay value DLY_MS<0:2> has a value corresponding to a delay amount between the reference clock signal CLK_REF and the feedback clock signal CLK_FED.

Figure 8:
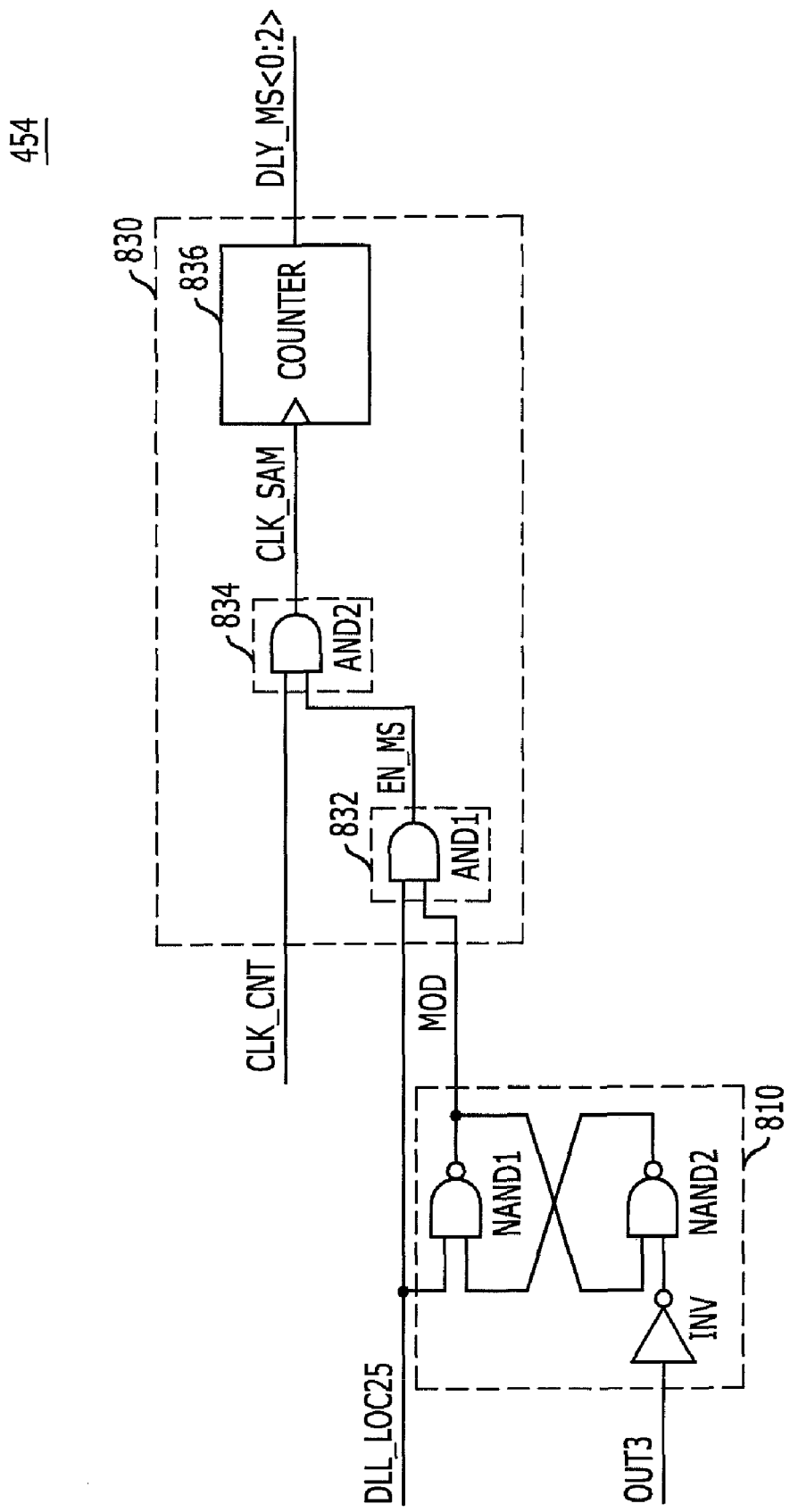
FIG. 8 is a diagram illustrating a measured delay value generator 454 of FIG. 4.

FIG. 8 is a diagram illustrating a measured delay value generator 454 of FIG. 4.

Referring to FIG. 8, the measured delay value generator 454 may include a mode signal generator 810 and a measured delay value counter 830.

The mode signal generator 810 generates a mode selection signal MOD in response to the third output signal OUT3 of the measured delay replica model 452 and the synchronized locking completion signal DLL_LOC25. The mode signal generator 810 includes a first NAND gate NAND1 for generating the mode selection signal MOD by receiving the synchronized locking completion signal DLL_LOC25 and an output signal of a second NAND gate NAND2, an inverter INV for receiving and inverting the third output signal OUT3, and the second NAND gate NAND2 for outputting a result signal by performing a NAND operation on the output signal of the first NAND gate NAND1 and the output signal of the inverter INV.

The mode selection signal MOD sustains a set state in response to the synchronized locking completion signal DLL_LOC25 and transits to a reset state in response to the third output signal OUT3. As described above in FIG. 7, the synchronized locking completion signal DLL_LOC25 is a signal generated by synchronizing the locking completion signal DLL_LOC with a falling edge of the external clock signal CLK_EXT. As described above in FIG. 4, the third output signal OUT3 is a signal generated by delaying the first output signal OUT1 for a time corresponding to the variable delay unit 430 and the measured delay replica model 452. Finally, a reset time of the mode selection signal MOD may be a time of passing the synchronized locking completion signal DLL_LOC25 activated in a locking completion state through the variable delay unit 430 and the measured delay replica model 452.

Meanwhile, the measured delay value counter 830 counts a counting clock signal CLK_CNT during a region defined by the synchronized locking completion signal DLL_LOC25 and the mode selection signal MOD. The measured delay value counter 830 includes an activation signal generator 832, a sampling clock generator 834, and a counter 836.

The activation signal generator 832 generates a measurement activation signal EN_MS having an activation width defined in response to the synchronized locking completion signal DLL_LOC25 and the mode selection signal MOD. The activation signal generator 832 may include a first AND gate AND1 for receiving the synchronized locking completion signal DLL_LOC25 and the mode selection signal MOD.

The sampling clock generator 834 samples a counting clock signal CLK_CNT in response to the measurement activation signal EN_MS and outputting the sampled signal as a sampling clock signal CLK_SAM. The sampling clock generator 834 includes a second AND gate AND2 for receiving the measurement activation signal EN_MS and the counting clock signal CLK_CNT.

The counter 836 generates a measured delay value DLY_MS<0:2> counted in response to the sampling clock signal CLK_SAM. The counter 836 may include a counter circuit performing a counting operation in response to a clock signal. The counter 836 according to the present embodiment may be a counter that generates a 3-bit measured delay value DLY_MS<0:2> by counting a sampling clock signal CLK_SAM. That is, the counter 386 may count the sampling clock signal CLK_SAM sampled for an activation period of the measurement activation signal EN_MS.

In other words, the activation period of the measurement activation signal EN_MS corresponds to the sum of a delay time reflected at the variable delay unit 430 and a delay time reflected at the measured delay replica model 452. The sampling clock signal CLK_SAM may be counted during the activation period of the measurement activation signal EN_MS.

Figure 9:
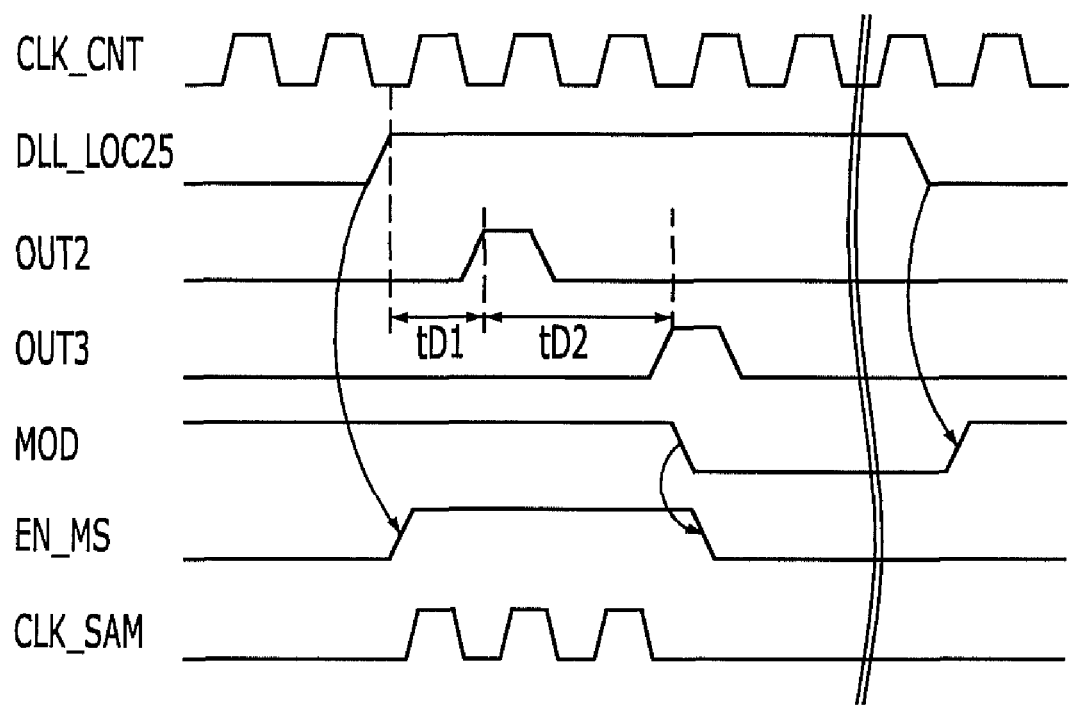
FIG. 9 is a waveform showing an operation timing of a measured delay value generator 454 of FIG. 8.

FIG. 9 is a waveform for describing an operation timing of a measured delay value generator 454 of FIG. 8. FIG. 9 shows a counting clock signal CLK_CNT, a synchronized locking completion signal DLL_LOC25, a second output signal OUT2, a third output signal OUT3, a mode selection signal MOD, a measurement activation signal EN_MS, and a sampling clock signal CLK_SAM.

Hereinafter, an operation timing of the measured delay value generator 454 will be described with reference to FIGS. 4, 7, 8, and 9.

If the locking completion signal DLL_LOC (see FIG. 7) is activated, the synchronized locking completion signal DLL_LOC25 is activated and the delay measurement pulse signal PUL_MS (see FIG. 7) is activated accordingly. The delay measurement pulse signal PUL_MS becomes the first output signal OUT1 of the selection output unit 410 (see FIG. 4) in the delay measurement mode. The first output signal OUT1 is delayed for tD1 by the variable delay unit 430 (see FIG. 4) and outputted as the second output signal OUT2. The second output signal OUT2 is delayed for tD2 by the measured delay replica model 452 (see FIG. 4) and outputted as a third output signal OUT3. Herein, the mode signal generator 810 generates a mode selection signal MOD that becomes logic high in response to the synchronized locking completion signal DLL_LOC25 and becomes logic low in response to the third output signal OUT. The logic high period of the mode selection signal MOD is a delay measurement mode for measuring a delay amount reflected at the delay locked loop DLL (see FIG. 13), and the logic low period of the mode selection signal MOD is a normal mode for performing an operation according to a read command.

Meanwhile, the measurement activation signal EM_MS defines its activation period in response to the synchronized locking completion signal DLL_LOC25 and the mode selection signal MOD. That is, the measurement activation signal EM_MS is activated to logic high in response to the synchronized locking completion signal DLL_LOC25 and inactivated to logic low in response to the mode selection signal MOD. Continuously, the counting clock signal CLK_CNT is sampled during the activation period of the measurement activation signal EN_MS by the sampling clock generator 834 and outputted as a sampling clock signal CLK_SAM. The generated sampling clock signal CLK_SAM is counted by the counter 836 and outputted as a measured delay value DLY_MS<0:2>. Herein, the sampling clock signal CLK_SAM is generated by sampling three counting clock signals CLK_CNT. However, the measured delay value DLY_MS<0:2> may have a counting value corresponding three counting clock signals CLK_CNT.

Then, the latency signal generating circuit shifts the synchronized locking completion signal DLL_LOC25 to logic low in response to the locking completion signal DLL_LOC (see FIG. 7) that is shifted to logic low. Accordingly, the latency signal generating circuit activates the mode selection signal MOD to logic high to enable the semiconductor device according to the present embodiment to enter the delay measurement mode again.

Referring back to FIG. 4, the latency signal output unit 470 synchronizes the second output signal OUT2 of the variable delay unit 430 with the DLL clock signal CLK_DLL and outputs a latency signal LTC corresponding to the measured delay value DLY_MS<0:2> and the CAS latency CL. Such a latency signal LTC becomes a signal that guarantees outputting data according to CAS latency based on an external clock signal CLK_EXT. The latency signal output unit 470 may receive the second output signal OUT2 only in a normal mode.

Meanwhile, the read command signal RD_EN is synchronized by the selection output unit 410 and outputted as a first output signal OUT1 in case of the normal mode. That is, as described in FIG. 5, the synchronized read command signal RD_EN15 is outputted as the first output signal OUT1. Then, the first output signal OUT1 is delayed by the variable delay unit 430 for tD1 and outputted as the second output signal OUT2. Herein, the second output signal OUT2 delayed for tD1 is located at around a falling edge of a DLL clock signal CLK_DLL. Therefore, the latency signal output unit 470 shifts the second output signal OUT2 located around the falling edge of the DLL clock signal CLK_DLL in response to a rising edge of the DLL clock signal CLK_DLL and outputs the shifted signal as a latency signal LTC. Herein, the latency signal LTC can be outputted at a time point corresponding to CAS latency CL by reflecting the measured delay value DLY_MS<0:2> thereat.

Figure 10:
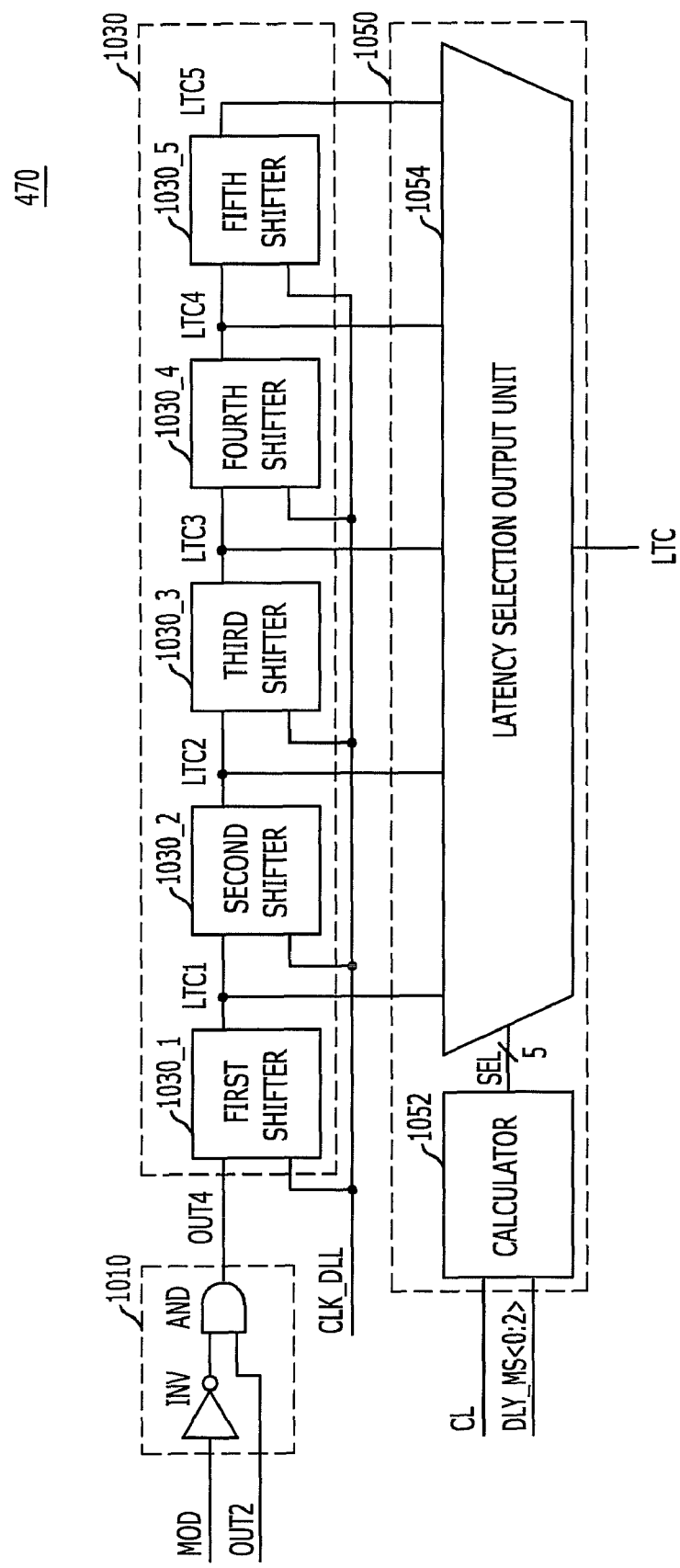
FIG. 10 is a diagram illustrating a latency signal output unit 470 of FIG. 4.

FIG. 10 is a diagram illustrating a latency signal output unit 470 of FIG. 4.

Referring to FIG. 10, the latency signal output unit 470 may include a signal input unit 1010, a plurality of shifters 1030, and a latency signal controller 1050.

The signal input unit 1010 receives the second output signal OUT2 in the normal mode. The signal input unit 1010 includes an inverter INV for receiving the mode selection signal MOD and an AND gate AND for receiving the second output signal OUT2 and an output signal of the inverter INV and outputting a fourth output signal OUT4. The signal input unit 1010 receives a second output signal OUT2 in response to the mode selection signal MOD and outputs the fourth output signal OUT4 corresponding to the second output signal OUT2. Herein, the mode selection signal MOD becomes logic low in the normal mode and becomes logic high in the delay measurement mode.

The plurality of shifters 1030 shift the fourth output signal OUT4 of the signal input unit 1010 in response to the DLL clock signal CLK_DLL. The plurality of shifters 1030 includes first to fifth shifters 1030_1, 1030_2, 1030_3, 1030_4, and 1030_5. Each of the first to fifth shifters 1030_1, 1030_2, 1030_3, 1030_4, and 1030_5 outputs an input signal in response to the DLL clock signal CLK_DLL. Each of the first to fifth shifters 1030_1, 1030_2, 1030_3, 1030_4, and 1030_5 may be formed of a D-flip-flop. That is, the first shifter 1030_1 outputs the fourth output signal OUT4 as a first latency signal LTC1 in response to the DLL clock signal CLK_DLL. The second shifter 1030_2 outputs the first latency signal LTC1 as a second latency signal LTC2 in response to the DLL clock signal CLK_DLL. The third shifter 1030_3 outputs the second latency signal LTC2 as a third latency signal LTC3 in response to the DLL clock signal CLK_DLL. The fourth shifter 1030_4 outputs the third latency signal LTC3 as a fourth latency signal LTC4 in response to the DLL clock signal CLK_DLL. The fifth shifter 1030_5 outputs the fourth latency signal LTC4 as a fifth latency signal LTC5 in response to the DLL clock signal CLK_DLL.

It is preferable that each of the first to fifth shifters 1030_1, 1030_2, 1030_3, 1030_4, and 1030_5 outputs a signal in response to a rising edge of the DLL clock signal CLK_DLL. For example, since the second output signal OUT2 is located around a falling edge of the DLL clock signal CLK_DLL, it is possible to stably synchronize an output signal at a rising edge of the DLL clock signal CLK_DLL at the first to fifth shifters 1030_1, 1030_2, 1030_3, 1030_4, and 1030_5. Hereinafter, an operation timing of a plurality of shifters 1030 will be described.

Figure 11:
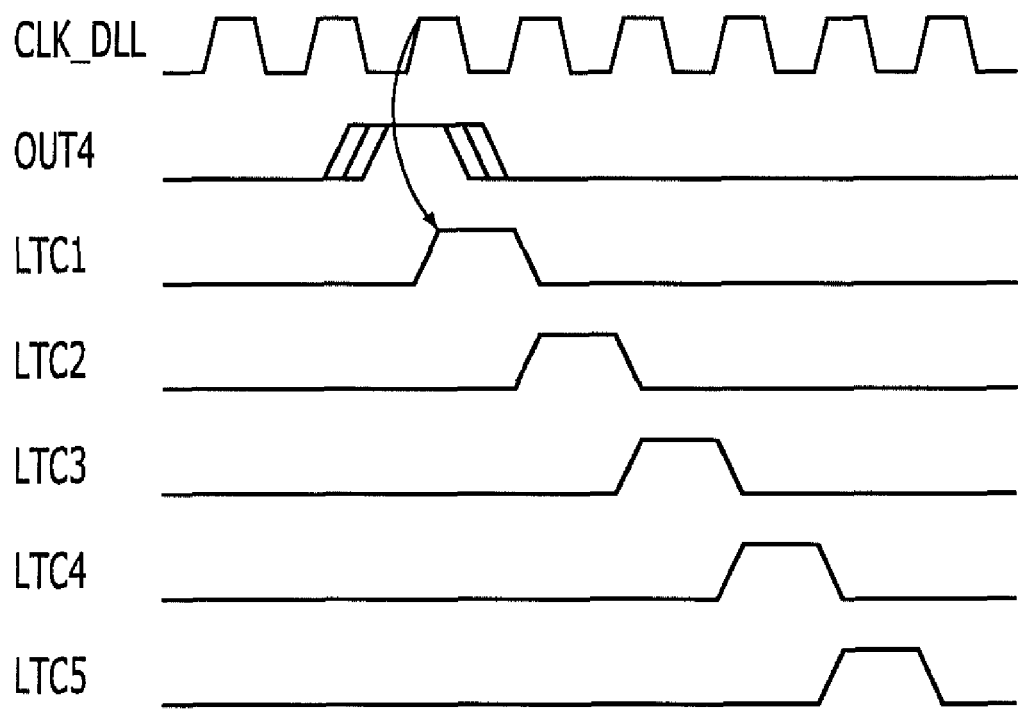
FIG. 11 is a waveform showing an operation timing of a plurality of shifters 1030 of FIG. 10.

FIG. 11 is a waveform showing an operation timing of a plurality of shifters 1030 of FIG. 10. FIG. 11 shows a DLL clock signal CLK_DLL, a fourth output signal OUT4, and first to fifth latency signals LTC1, LTC2, CTL3, LTC4, and LTC5.

Referring to FIGS. 10 and 11, the fourth output signal OUT4 may be located at around a falling edge of a DLL clock signal CLK_DLL. Such a fourth output signal OUT4 becomes a first latency signal LTC1 by being synchronized with a rising edge of the DLL clock signal CLK_DLL at the first shifter 1030_1. The first latency signal LTC1 becomes a second latency signal LTC2 by being synchronized with a rising edge of the DLL clock signal CLK_DLL at the second shifter 1030_2. Each of the third to fifth shifters 1030_3, 1030_4, and 1030_5 synchronizes an input signal with the rising edge of the DLL clock signal CLK_DLL and outputs a third, a fourth, or a fifth latency signal LTC3, LTC4, and LTC5, respectfully.

Referring to FIG. 10 again, the latency signal controller 1050 outputs one of the first to fifth latency signals LTC1, LTC2, LTC3, LTC4, and LTC5, which are output signals of the first to fifth shifters 1030_1, 1030_2, 1030_3, 1030_4, and 1030_5, as a latency signal LTC in response to CAS latency CL and a measured delay value DLY_MS<0:2>. The latency signal controller 1050 includes a calculator 1052 and a latency selection output unit 1054.

The calculator 1052 generates a selection signal SEL for selecting one of the first to fifth latency signals LTC1, LTC2, LTC3, LTC4, and LTC5 by calculating CAS latency CL and a measured delay value DLY_MS<0:2>. The calculator 1052 may be designed as a calculation circuit for subtracting the measured delay value DLY_MS<0:2> from CAS latency CL. The selection signal SEL may be signals for respectively selecting the first to fifth latency signals LTC1, LTC2, LTC3, LTC4, and LTC5. The selected latency signal can guarantee a read operation of a semiconductor device for outputting data according to CAS latency CL after a read command.

The latency selection output unit 1054 outputs one of the first to fifth latency signals LTC1, LTC2, LTC3, LTC4, and LTC5 as a latency signal LCT in response to the selection signal SEL. The latency selection output unit 1054 may be designed as a multiplexer circuit.

FIGS. 12A and 12B are waveforms showing an operation of a latency signal generating circuit in accordance with an embodiment of the present invention. In FIGS. 12A and 12B, for convenience in description, CAS latency is set to 5 and a time for generating a read command signal RD_EN15 by synchronizing a read command signal RD_EN is ignored.

At first, it assumes that a time 1$t$CK corresponds to the sum of a time tD1 and a time tD2 in a delay measurement mode and a sampling clock signal CLK_SAM is toggled one time in FIG. 12A. Then, the measured delay value DLY_MS<0:2> may become 1 corresponding to the one-time toggled sampling clock signal CLK_SAM. Then, the calculator 1052 (see FIG. 10) generates a selection signal SEL by subtracting 1 as the measured delay value DLY_MS<0:2> from 5 as the CAS latency. The latency selection output unit 1054 selects the fourth latency signal LTC4, which is not activated yet, in response to the selection signal SEL and outputs the selected fourth latency signal LTC4 as the latency signal LTC.

Referring to FIGS. 10 and 12A, when a read command RD is applied in a normal mode, a first output signal OUT1 is activated, and a second output signal OUT2, which is generated by delaying the first output signal OUT1 for a time tD1, is activated. As shown, the external clock signal CLK_EXT and the DLL clock signal CLK_EXT have a phase difference of tD1. Therefore, the second output signal OUT2, which is generated by delaying the first output signal OUT1 synchronized with a falling edge of the external clock signal CLK_EXT for tD1, may be located at around a falling edge of the DLL clock signal CLK_DLL. Such a second output signal OUT2 is shifted in response to a rising edge of the DLL clock signal CLK_DLL. Herein, the second output signal OUT2 becomes the fourth latency signal LCT4 decided in the delay measurement mode, which is a signal activated at a fourth time point of the DLL clock signal CLK_DLL. The fourth latency signal LTC4 becomes a latency signal LTC immediately. First to fourth data D0 to D3 may be outputted in response to the latency signal LTC. If the CAS latency is 4, the latency signal LTC may be activated in response to a third time point of the DLL clock signal CLK_DLL.

Meanwhile, if the latency signal LTC is required to be activated 1$t$CK-faster than CAS latency CL by an internal timing of a semiconductor device when the CAS latency CL is 5, the second output signal OUT2 may be shifted by a time corresponding to a result of subtracting 1 corresponding to the internal timing 1$t$CK and 1, which is the sum of tD1 and tD2, from 5 as the CAS latency CL. That is, the second output signal OUT2 may become a latency signal LTC that is activated in response to a third time point of the DLL clock signal CLK_DLL.

It is assumed that a sum of tD1 and tD2 corresponds 2$t$CK in a delay measurement mode and the sampling clock signal CLK_SAM is toggled two times in FIG. 12B. The measured delay value DLY_MS<0:2> may become, for example, 2 corresponding to the two times toggled sampling clock signal CLK_SAM. Therefore, the calculator 1052 (see FIG. 10) generates a selection signal SEL by subtracting 2 as the measured delay value DLY_MS<0:2> from 5 as CAS latency CL. The latency selection output unit 1054 selects a third latency signal LTC3, which is not activated yet, in response to the selection signal SEL and outputs the selected third latency signal LTC3 as the latency signal LTC.

Referring to FIGS. 10 and 12B, when a read command RD is applied in a normal mode, a first output signal OUT1 is activated and a second output signal OUT2, which is generated by delaying the first output signal OUT1 for tD1, is activated. As shown, the second output signal OUT2 is located at around a falling edge of the DLL clock signal CLK_DLL. Such a second output signal OUT2 is shifted in response to a rising edge of the DLL clock signal CLK_DLL. The second output signal OUT2 becomes a third latency signal LTC3 which is decided in the delay measurement mode and activated at a third time point of the DLL clock signal CLK_DLL. The third latency signal LTC3 becomes the latency signal LTC immediately. The first to fourth data D0 to D3 may be outputted in response to the latency signal LTC.

The latency signal generating circuit according to the present embodiment includes two operations for generating the latency signal LTC. The first operation is an operation in the delay measurement mode. The latency signal generating circuit according to the present embodiment measures an internal delay time of a semiconductor device and generates the measured delay value DLY_MS<0:2> resulting the delay measurement mode. The second operation is an operation in the normal mode. The latency signal generating circuit according to the present embodiment performing a domain crossing operation by delaying a read command RD for tD1, and generates a latency signal according to the corresponding CAS latency CL by calculating the CAS latency based on the measured delay value DLY_MS<0:2> measured in the delay measurement mode.

A latency signal generating circuit according to the prior art always requires the DLL clock signal CLK_DLL to generate a latency signal LTC. That is, the latency signal generating circuit according to the prior art continuously counts the DLL clock signal CLK_DLL for a read command RD although it is not known when the read command RD will be applied. However, the latency signal generating circuit according to the present embodiment does not always require the DLL clock signal CLK_DLL because the necessary information for generating the latency signal LTC is defined by using the measured delay value DLY_MS<0:2> and the CAS latency CL. That is, the semiconductor device according to the present embodiment can normally operate although the delay locked loop DLL according to the present embodiment is enabled only in a period for generating the delay control signal CTR_DLY in the delay measurement mode and in a period for outputting data corresponding to a read command in the normal mode.

FIG. 13 is a block diagram illustrating a circuit for generating a DLL clock signal CLK_DLL. FIG. 13 shows an input controller 1310 and a delay locked loop 1330.

The input controller 1310 can control the activation of a reference clock signal CLK_REF generated based on an external clock signal CLK_EXT in response to a read command signal RD_EN and a latency signal LTC. That is, the input controller 1310 activates the reference clock signal CLK_REF to be toggled corresponding to the external clock signal CLK_EXT in response to the read command signal RD_EN and inactivates the reference clock signal CLK_REF in response to the latency signal LTC.

The delay locked loop 1330 detects a phase difference between the reference clock signal CLK_REF and a feedback clock signal CLK_FED, generates a delay control signal CTR_DLY based on the detected phase difference, generates a DLL clock signal CLK_DLL by delaying the reference clock signal CLK_REF for a time corresponding to the delay control signal CTR_DLY, and generates a feed clock signal CLK_REF by reflecting a delay of a real clock/data path at the DLL clock signal. The delay locked loop 1330 includes a phase comparator 1332, a control signal generator 1334, a variable delay unit 1336, and a DLL delay replica model 1338.

The phase comparator 1332 compares a phase of the reference clock signal CLK_REF and a phase of the feedback clock signal CLK_FED and outputs a detection signal DET based on the comparison result. For example, if the phase of the feedback clock signal CLK_FED lags behind that of the reference clock signal CLK_REF, the detection signal DET becomes logic high. If the phase of the feedback clock signal CLK_FED is ahead of that of the reference clock signal CLK_REF, the detection signal DET becomes logic low.

The control signal generator 1334 may generate a delay control signal CTR_DLY in response to the detection signal DET. Herein, the control signal generator 1334 may generate n delay control signals CTR_DLY where n is an integer number. Accordingly, the variable delay unit 1336 may include n unit delay cells.

The variable delay unit 1336 may output a DLL clock signal CLK_DLL by delaying a reference clock signal CLK_REF according to a delay control signal CTR_DLY. The variable delay unit 1336 includes a plurality of unit delay cells. Each of the plurality of unit delay cells may be enabled in response to a corresponding delay control signal CTR_DLY. Therefore, a delay amount of the reference clock signal is decided according to the number of enabled unit delay cells.

The DLL delay replica model 1338 may generate a feedback clock signal CLK_FED by reflecting a delay of a read clock/data path at a DLL clock signal CLK_DLL outputted from the variable delay unit 1336. The DLL delay replica model 1338 may be formed identically to a circuit of a path transferring the DLL clock signal CLK_DLL inside a semiconductor device.

The delay locked loop 1330 according to the present embodiment can activate or inactivate a DLL clock signal CLK_DLL according to a reference clock signal CLK_REF that is controlled by the input controller 1310 to activate or inactivate. That is, whether the reference clock signal CLK_REF is activated or not means whether the delay locked loop 1330 operates or not.

Hereinafter, an operation period of a delay locked loop 1330 according to the present embodiment will be described.

The delay locked loop 1330 according to the present embodiment can be enabled in a period of generating a delay control signal according to completion of locking and a period of outputting data corresponding to a read command. That is, although the delay locked loop 1330 according to the present embodiment does not operate in other periods, the latency signal generating circuit thereof does not have any problem to generate a latency signal LTC. Therefore, the delay locked loop 1330 according to the present embodiment can reduce power consumption by being controlled to operate as needed.

Figure 14:
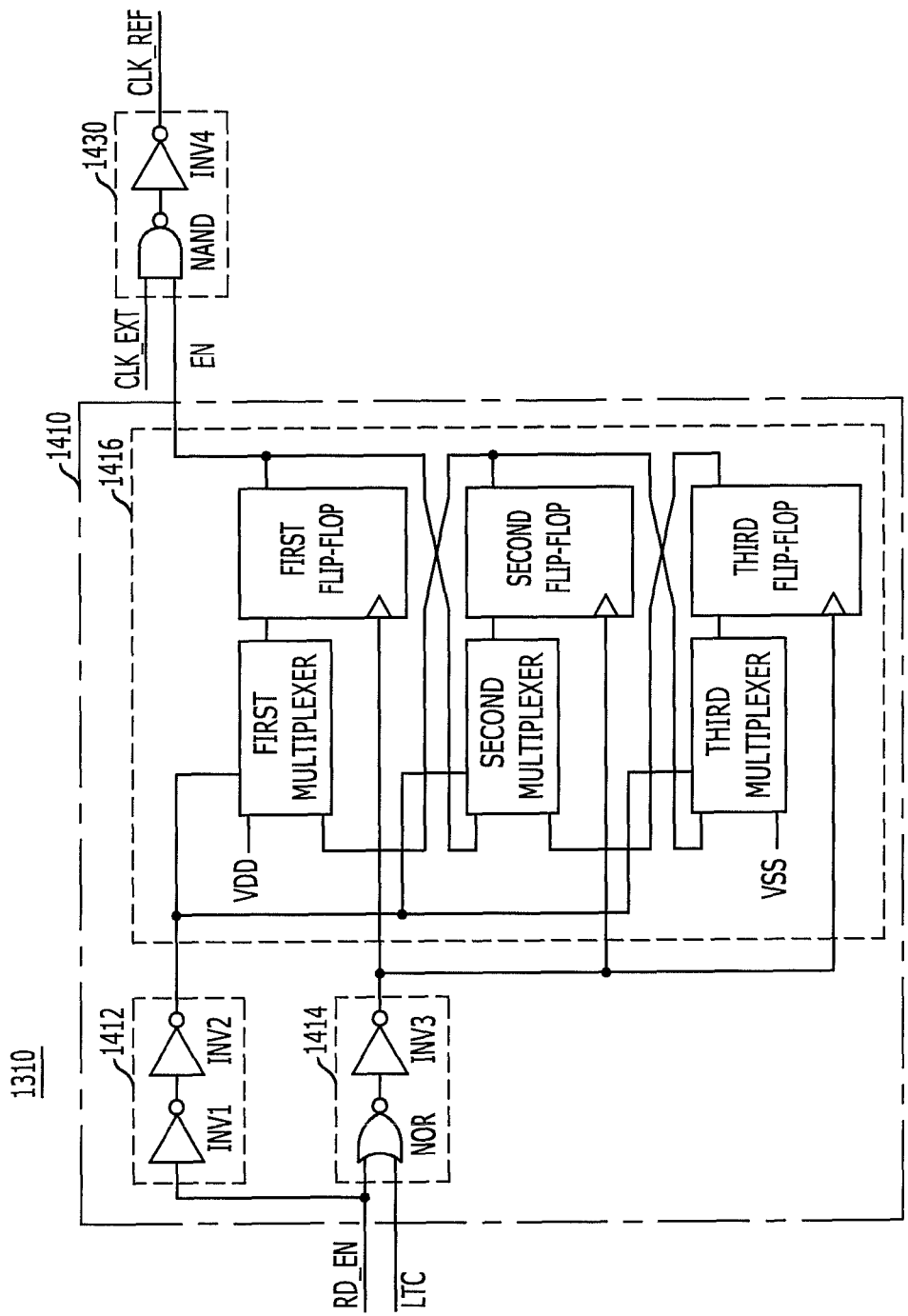
FIGS. 14 to 16 are diagrams showing an input controller 1310 of FIG. 13 according to various embodiments.
Figure 15:
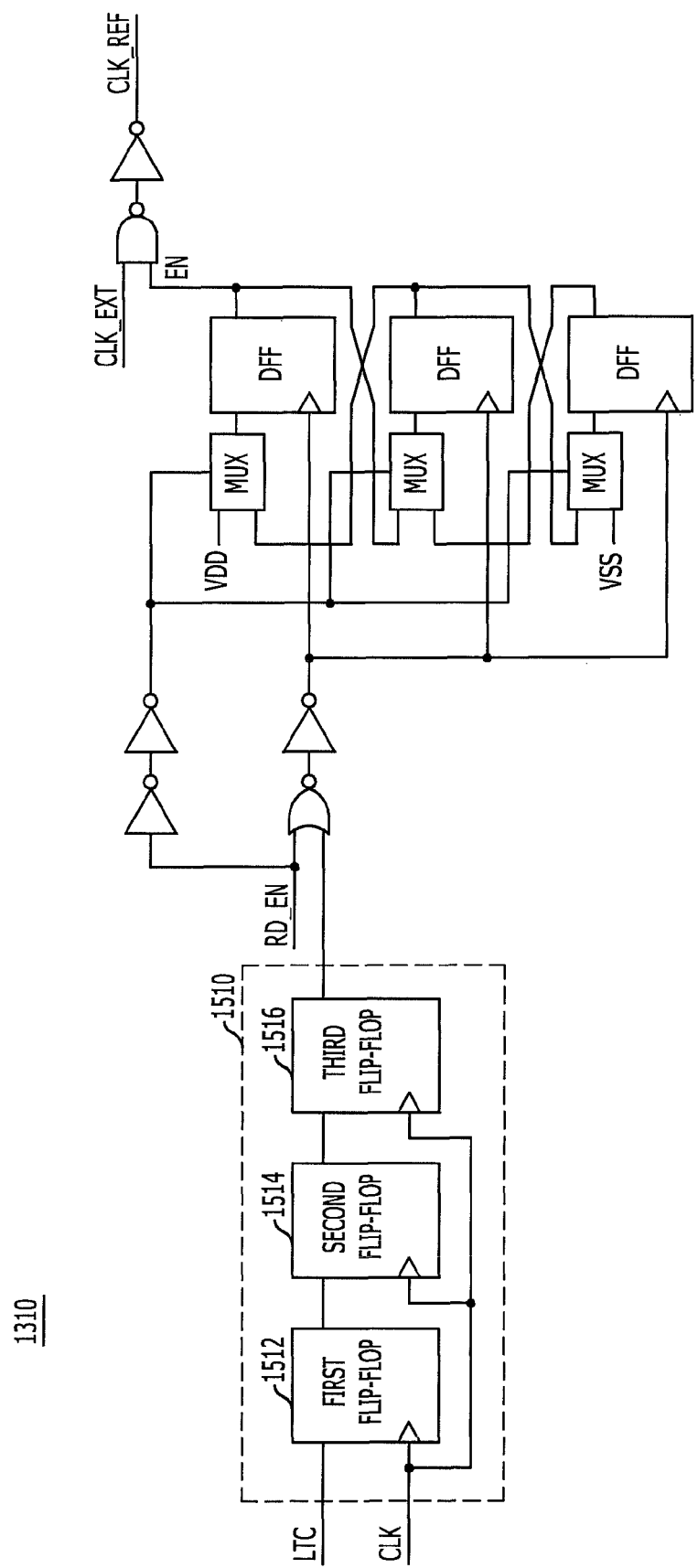
Figure 16:
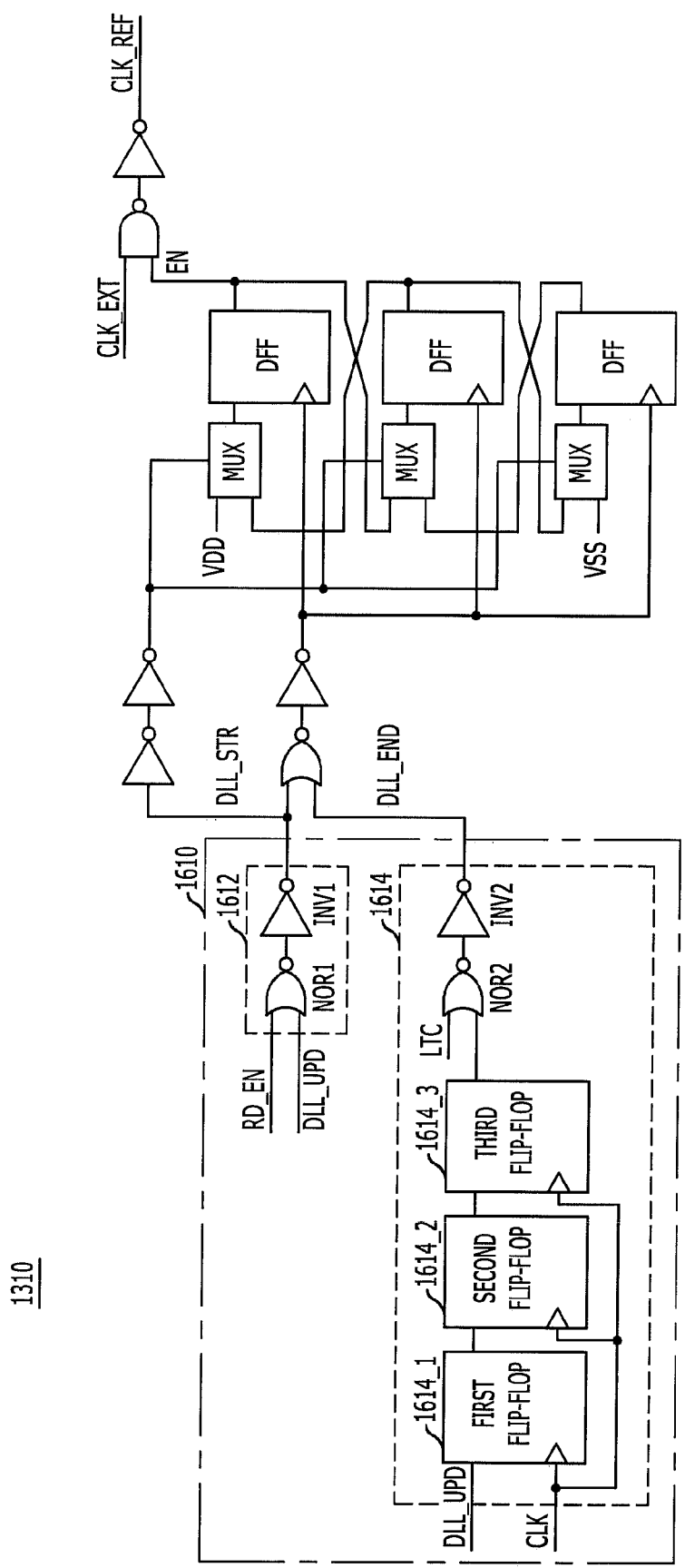

FIGS. 14 to 16 are diagrams showing an input controller 1310 of FIG. 13 according to various embodiments.

Referring to FIG. 14, the input controller 1310 may include an activation signal generator 1410 and a clock signal output unit 1430.

The activation signal generator 1410 outputs an activation signal EN in response to a read command signal RD_EN and a latency signal LTC. The activation signal generator 1410 may include a selection signal generator 1412, a shifting signal generator 1414, and a shifting storing unit 1416.

The selection signal generator 1412 controls output signals of first to third multiplexers included in the shifter storing unit 1416. The selection signal generator 1412 includes a first inverter INV1 for receiving the read command signals RD_EN and a second inverter INV2 for receiving an output signal of the first inverter INV1.

The shifting signal generator 1414 controls shifting operations of first to third flip-flops included in the shifting storing unit 1416. The shifting signal generator 1414 includes a NOR gate for receiving the read command signal RD_EN and the latency signal LTC and a third inverter INV3 for receiving an output signal from the NOR gate.

The shifting storing unit 1416 may include the first to third multiplexers and the first to third flips-flops (reference omission). Output signals of the first to third multiplexers are selected by an output signal of the selection signal generator 1412. An input signal of the first to third flip-flops is shifted in response to an output signal of the shifting signal generator 1414. Herein, the first to third multiplexers may output a signal applied to a first input end or a second input end according to an output signal of the selection signal generator 1412. The first to third flip-flops may store or shift corresponding output signals of the first to third multiplexers in response to an output signal of the shifting signal generator 1414. The shifting storing unit 1416 may be formed of a bidirectional shift register.

Meanwhile, the clock signal output unit 1430 outputs the external clock signal CLK_EXT as the reference clock signal CLK_REF in response to the activation signal EN outputted from the activation signal generator 1410. The clock signal output unit 1430 includes a NAND gate for receiving the activation signal EN and the external clock signal CLK_EXT and a fourth inverter INV4 for receiving an output signal of the NAND gate and outputting the received signal as a reference clock signal CLK_EXT.

The operation of the input controller 1310 will be described hereinafter. For illustration purposes, a description of a locking operation and output operations of a plurality of data corresponding to burst length is not necessary.

At first, when an activation signal EN is inactivated to logic low before a read command signal RD_EN is activated, a reference clocking signal CLK_REF is not toggled. That is, the delay locked loop 1330 (see FIG. 13) for generating a DLL clock signal CLK_DLL in response to the reference clock signal CLK_REF is disabled. If the read command signal RD_EN is activated, the activation signal EN is activated to logic high. Then, the reference clock signal CLK_REF is toggled based on the external clock signal CLK_EXT. That is, the delay locked loop 1330 is enabled and generates the DLL clock signal CLK_ELL. Meanwhile, if the latency signal LTC is activated to logic high, the activation signal EN is inactivated to logic low and the reference clock signal CLK_REF is not toggled. That is, the delay locked loop 1330 may be disabled.

The first to third flip-flops correspond to a plurality of read commands inputted corresponding to tCCD (Column address to Column address Delay). Therefore, it is preferable to design the number of flip-flops corresponding to consecutive input read commends. That is, in this embodiment, the number of flip-flops corresponds to the case that three read commands are inputted. The activation signal EN is inactivated to logic low in response to a latency signal LTC corresponding to the last input read command. Herein, the latency signal LTC is generated in the latency signal generating circuit, corresponding to a period not requiring the DLL clock signal CLK_DLL. It is preferable to control the latency signal LTC in consideration of a burst length if the burst length is considered. FIG. 15 shows an input controller according to another embodiment of the present invention, which has a structure dependent on a burst length.

The input controller according to another embodiment in FIG. 15 includes a shifter 1510 additionally compared to the input controller of FIG. 14.

The shifter 1510 shifts the latency signal LTC according to a clock signal CLK. The shifter 1510 includes first to third flip-flops 1512, 1514, and 1516. Herein, the first flip-flop 1512 shifts the latency signal LTC in response to the clock signal CLK. The second flip-flop 1514 shifts an output signal of the first flip-flop 1512 in response to the clock signal CLK. The third flip-flop 1516 shifts an output signal of the second flip-flop 1514 in response to the clock signal CLK. Herein, an output signal of the third flip-flop 1516 is a signal for inactivating the activation signal EN to logic low.

The input controller according to another embodiment in FIG. 15 activates the activation signal EN in response to the read command signal RD_EN and inactivates the activation signal EN when the clock signal CLK is toggled three times after the latency signal LTC is activated. The time of inactivating the activation signal EN may differ according to the number of flip-flops. That is, the design of the input controller may differ according to a time to disable the delay locked loop 1330.

Meanwhile, the delay locked loop 1330 performs an update operation regularly after completely locking or performs the update operation in response to a predetermined command, according to an operation of a semiconductor device. FIG. 16 shows an input controller according to still another embodiment of the present invention, which is designed in consideration of the update operation of the delay locked loop 1330.

The input controller according to still another embodiment of FIG. 16 additionally includes an update controller 1610, compared to the input controller of FIG. 14. For illustration purposes, description of operations related to a read command signal RD_EN and a latency signal LTC is not necessary and is thus omitted.

The update controller 1610 includes a start signal generator 1612 and an end signal generator 1614. The start signal generator 1612 generates a DLL start signal DLL_STR in response to a DLL update signal DLL_UPD. The end signal generator 1614 generates a DLL end signal DLL_END in response to a DLL update signal DLL_UPD. The DLL update signal DLL_UPD is a signal activated by the regular update operation of the delay locked loop 1330 or the predetermined update operation as described above.

The start signal generator 1612 includes a first NOR gate NOR1 for receiving the read command signal RD_EN and the DLL update signal DLL_UPD and a first inverter INV1 for receiving the output signal of the first NOR gate NOR1 and outputting the DLL start signal DLL_STR. The end signal generator 1614 includes first to third flip-flops 1614_1, 1614_2, and 1614_3 for shifting the DLL update signal DLL_UPD according to a clock signal CLK, a second NOR gate NOR2 for receiving the latency signal LTC and an output signal of the third flip-flop 1614_3, and a second inverter INV2 for receiving an output signal of the second NOR gate NOR2 and outputting the DLL end signal DLL_END. The output signal of the third flip-flop 1614_3 is a signal for inactivating the activation signal EN to logic low.

That is, the input controller according to still another embodiment of FIG. 16 activates the activation signal EN in response to the DLL update signal DLL_UPD and inactivates the activation signal EN at a time point of toggling the clock signal CLK three times after the activation signal EN is activated. The time point of inactivating the activation signal EN may differ according to the number of flip-flops. The design of the input controller may differ according to a time point of disabling the delay locked loop 1330.

A conventional latency signal generating circuit continuously consumes power due to counting and comparison operations even before receiving a read command as described above. Also, a conventional delay locked loop DLL continuously consumes power for generating a DLL clock signal CLK_DLL used for the counting operation. However, the latency signal generating circuit according to the present embodiment has a structure for generating a latency signal LTC without a counter circuit and a comparison circuit which were included in the conventional latency signal generating circuit. Therefore, the latency signal generating circuit according to the present embodiment does not waste unnecessary power unlike the conventional art. Further, since the latency signal generating circuit according to the present embodiment determines a desired latency signal through a delay measurement mode in advance, the latency signal generating circuit according to the present embodiment can have periods for not applying a DLL clock signal CLK_DLL. Finally, the power consumption can be minimized because the delay locked loop 1330 according to the present embodiment can be controlled not to be operated in the periods.

As shown in FIGS. 11, 12A, and 12B, the fourth output signal OUT4 and the second output signal OUT2 may be located at around a falling edge of the DLL clock signal CLK_DLL. Therefore, there is a margin generated between a falling edge of a DLL clock signal and a next rising edge of the DLL clock signal CLK_DLL. Herein, the fourth output signal OUT4 and the second output signal OUT2 of the variable delay unit 430 (see FIG. 4) may be the same signal. Therefore, a unit delay amount of the variable delay unit 430 is not required to be minutely designed according to the generated margin unlike the unit delay amount of the variable delay unit 1336 of FIG. 13. That is, it is possible to design the unit delay amount of the variable delay unit 430 of FIG. 4 to be comparatively large. Substantially, since the variable delay unit 1336 of FIG. 13 is required to be designed to have small dimensions, the variable delay unit 1336 has a very dense unit delay amount and a circuit size thereof is also comparatively large.

Figure 17:
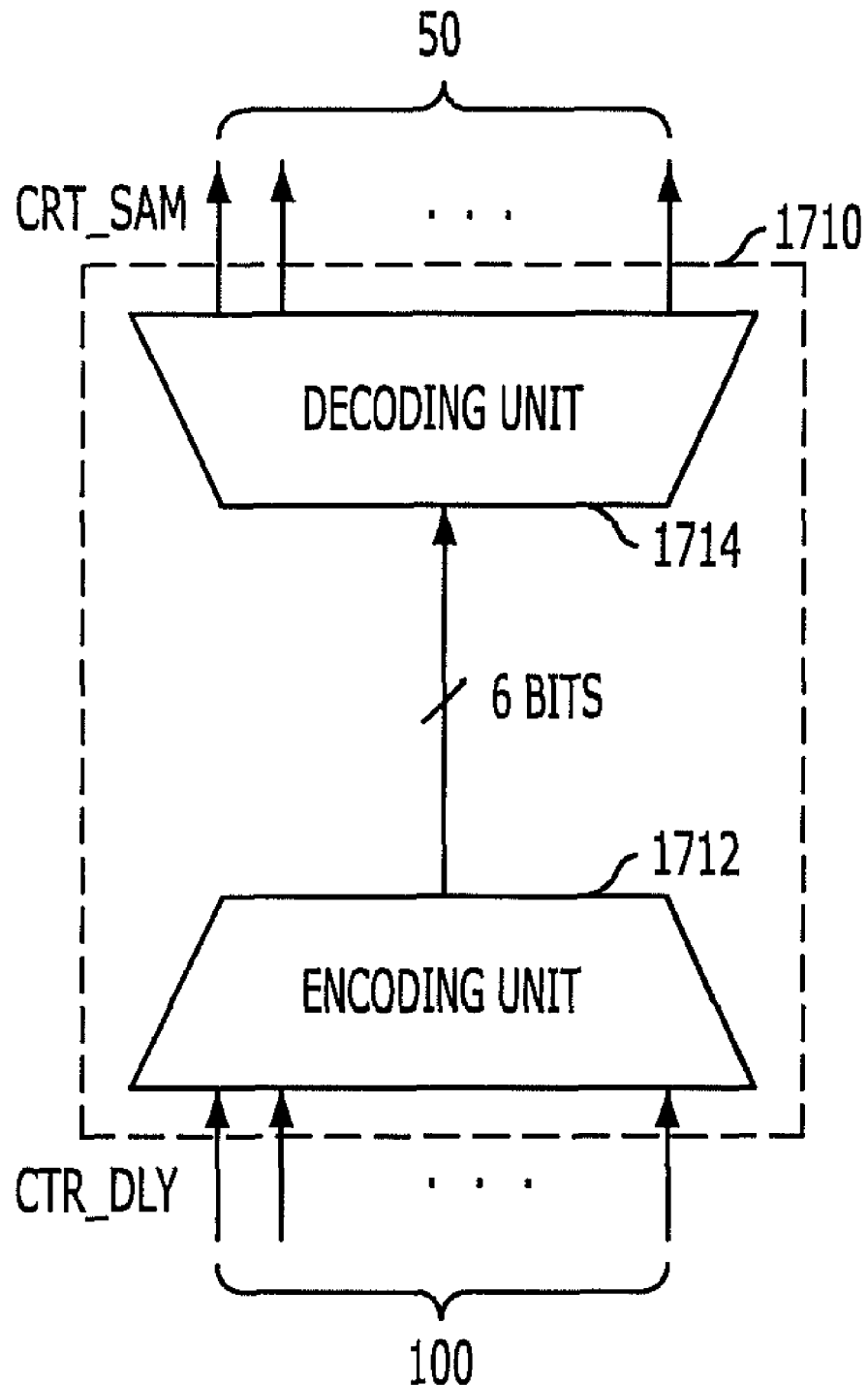
FIG. 17 illustrates a block diagram generating a control signal of a variable delay unit 430 of FIG. 4.

FIG. 17 illustrates a block diagram generating a control signal of a variable delay unit 430 of FIG. 4.

Referring to FIGS. 4 and 17, a control signal sampling unit 1710 is further provided to generate a plurality of sampling control signals CTR_SAM for controlling the variable delay unit 430 of FIG. 4 by sampling a plurality of delay control signals CTR_DLY outputted from the control signal generator 1334. The control signal sampling unit 1710 may include an encoding unit 1712 and a decoding unit 1714. For convenience in description, it assumes that 50 sampling control signals CTR_SAM are generated by sampling 100 delay control signals CTR_DLY. Also, an encoded output signal of 100 delay control signals CTR_DLY is assumed as a 6-bit signal.

The encoding unit 1712 encodes 100 delay control signals CTR_DLY and generates a 6-bit output signal. The decoding unit 1714 decodes the 6-bit output signal and generates 50 sampling control signals CTR_SAM. The variable delay unit 1336 of FIG. 13 includes unit delay cells corresponding 100 delay control signals and is controlled by a minute delay unit. The variable delay unit 430 of FIG. 4 includes unit delay cells corresponding to the 50 sampling control signals CTR_SAM and is controlled by a delay unit bigger than that of the variable delay unit 1336. That is, the variable delay unit 430 of FIG. 4 may be designed to have a unit delay cell having a longer delay time than the variable delay unit 1336 of FIG. 13. As described above, the variable delay unit 430 can be reduced in size through suitable design schemes. Therefore, it may reduce limitation of chip layout when a chip is designed.

The delay locked loop according to the present invention can select a latency signal corresponding CAS latency before receiving a read command signal by measuring various reflected delays. Therefore, the power consumption before receiving the read command can be minimized.

The delay locked loop according to the present invention can be enabled only for desired periods. Therefore, power consumption for generating a DLL clock signal can be minimized.

While the present invention has been described with respect to the specific embodiments, it will be apparent to those skilled in the art that various changes and modifications may be made without departing from the spirit and scope of the invention as defined in the following claims.

For example, although the aforementioned embodiments were exemplarily described to use a delay locked loop, the present invention is not limited thereto. The present invention can be applied to an internal clock signal generating circuit such as a phase locked loop PLL having delay information of an external clock signal and an internal clock signal. Although the abovementioned embodiments were exemplary described to control an input end of a delay locked loop, the present invention is not limited thereto. The present invention can be applied to directly controlling operation of a constituent element of a delay locked loop or controlling an output end outputting a DLL clock signal CLK_DLL.

Also, locations and types of logic gates and transistors described in the above mentioned embodiments may be embodied differently according to a polarity of an input signal.

What is claimed is:

1. A semiconductor device comprising:
   an internal clock signal generating block configured to generate a delay control signal by detecting a phase difference between a reference clock signal and a feedback clock signal and generate an internal clock signal and the feedback clock signal;
   a latency signal generating block configured to receive locking completion information of the internal clock signal generation block, receive a column address strobe (CAS) latency value, generate a latency signal by synchronizing a read command signal with the internal clock signal, and calculate a measure delay value, wherein the latency signal is activated at a time determined in response to the CAS latency value and the measured delay value and, in response to the locking completion information, the measured delay value is calculated based on a phase difference between the reference clock signal and the feedback clock signal; and
   an input controlling block configured to activate the reference clock signal using an external clock signal in response to the read command signal and the latency signal.

2. The semiconductor device of claim 1, wherein the input controlling block includes:

an activation signal generator configured to generate an activation signal, wherein an activation period of the activation signal is defined in response to the read command signal and the latency signal; and a clock signal output unit configured to output the external clock signal as the reference clock signal in response to the activation signal.

3. The semiconductor device of claim 2, wherein the activation signal generator includes:

a selection signal generating unit configured to generate a selection control signal in response to the read command signal;

a shifting signal generating unit configured to generate a shifting control signal in response to the read command signal and the latency signal; and a shifting storing unit configured to output the activation signal by shifting a signal corresponding to the selection control signal according to the shifting control signal.

4. The semiconductor device of claim 2, wherein the activation signal is activated in response to the read command signal and inactivated in response to the latency signal.

5. The semiconductor device of claim 3, wherein the shifting signal generating unit includes a plurality of shifters configured to shift the latency signal in response to a clock signal.

6. The semiconductor device of claim 5, wherein the activation signal is activated in response to the read command signal and inactivated in response to an output signal of the plurality of shifters.

7. The semiconductor device of claim 3, wherein the selection signal generating unit and the shifting signal generating unit are configured to receive an update control signal, wherein the update control signal is activated when the internal clock signal generating unit is to performs an update operation, and wherein the shifting signal generating unit includes a plurality of shifters configured to shift the update control signal in response to a clock signal.

8. The semiconductor device of claim 3, wherein the shifting storing unit includes a bidirectional shift register.

9. The semiconductor device of claim 1, wherein the internal clock signal generating block includes:

a phase comparator configured to compare a phase of the internal clock signal with a phase of the feedback clock signal;

a control signal generator configured to generate the delay control signal in response to an output signal of the phase comparator;

a first variable delay unit configured to generate the internal clock signal by delaying the reference clock signal for a time corresponding to the delay control signal; and a first delay replica model configured to output the feedback clock signal by reflecting the delay of the clock path at the internal clock signal.

10. The semiconductor device of claim 1, wherein an enablement of the internal clock signal generating block is controlled in response to the read command signal and enabling of the latency signal.

11. The semiconductor device of claim 9, wherein the latency signal generating block includes:

a selection output circuit configured to selectively output the read command signal and the locking completion information in synchronization with the external clock signal according to a normal mode and a delay measurement mode;

a second variable delay circuit configured to delay an output signal of the selection output unit for a period of time corresponding to the delay control signal;

a delay time measuring circuit configured to generate the measured delay value by measuring a delay through second variable delay unit and a delay through the first delay replica model; and a latency signal output circuit configured to output the latency signal by synchronizing an output signal of the second variable delay unit with the internal clock signal according to the measured delay value and the CAS latency value.

12. The semiconductor device of claim 11, wherein the normal mode is a mode for performing a read operation in response to the read command signal after locking operation of the internal clock signal generating block and the delay measurement mode is a mode for generating the measured delay value after the locking operation.

13. The semiconductor device of claim 11, wherein the selection output circuit includes:

a read command signal synchronizer configured to output the read command signal in synchronization with the external clock signal in the normal mode;

a locking completion signal synchronizer configured to output the locking completion signal in synchronization with the external clock signal in the delay measurement mode; and a multiplexer configured to output one of an output signal of the read command signal synchronizer and an output signal of the locking completion signal synchronizer depending on whether the selection output circuit is operating in the normal mode or the delay measurement mode.

14. The semiconductor device of claim 13, wherein the locking completion signal synchronizer includes:

a synchronizing unit configured to synchronize the locking completion signal with the external clock signal and output the synchronized signal as a synchronized locking completion signal; and a pulse signal generating unit configured to generate a delay measurement pulse signal having a predetermined pulse width, wherein the pulse width is determined in response to the synchronized locking completion signal.

15. The semiconductor device of claim 14, wherein the delay time measuring circuit includes:

a second delay replica model configured to delay an output signal of the second variable delay circuit for a period of time equal to the delay through the first delay replica model; and a measured delay value generator configured to generate the measured delay value by counting a counting clock signal in response to the synchronized locking completion signal and an output signal of the second delay replica model.

16. The semiconductor device of claim 15, wherein the measured delay value generator includes:

a mode signal generating unit configured to generate a mode selection signal in response to the synchronized locking completion signal and the output signal of the second delay replica model; and a measured delay value counting unit configured to count the counting clock signal during a period defined by the synchronized locking completion information and the mode selection signal.

17. The semiconductor device of claim 16, wherein the mode selection signal maintains a set state in response to the synchronized locking completion signal and enters a reset state in response to the output signal of the second delay replica model.

18. The semiconductor device of claim 16, wherein the measured delay value counting unit includes:
- a measurement activation signal generating unit configured to generate a measurement activation signal in response to the synchronized locking completion signal and the mode selection signal;
- a sampling clock generating unit configured to generate a sampling clock signal by sampling the counting clock signal in response to the measurement activation signal; and
- a counting unit configured to count the sampling clock signal and output the count.

19. The semiconductor device of claim 11, wherein the latency signal output circuit includes:
- a signal input unit configured to receive an output signal of the second variable delay circuit in the normal mode;
- a plurality of shifters configured to shift an output signal of the signal input unit in response to the internal clock signal; and
- a latency signal controller configured to output one of output signals of the plurality of shifters as the latency signal in response to the CAS latency value and the measured delay value.

20. The semiconductor device of claim 19, wherein the latency signal controller includes:
- a calculating unit configured to output a selection signal by calculating the CAS latency value and the measured delay value; and
- a selection output unit configured to output one of the output signals of the plurality of shifters in response to the selection signal.

21. The semiconductor device of claim 19, wherein the latency signal is one selected among the output signals of the plurality of shifters before the read command signal is activated and the latency signal is activated in response to the read command signal.

22. The semiconductor device of claim 11, further comprising:
- a control signal sampling circuit configured to generate a sampling control signal for controlling the second variable delay circuit by sampling the delay control signal.

23. The semiconductor device of claim 22, wherein the control signal sampling circuit includes:
- an encoder configured to encode the delay control signal; and
- a decoder configured to generate the sampling control signal by decoding an output signal of the encoder.

24. The semiconductor device of claim 22, wherein the second variable delay circuit includes a number of unit delay cells, wherein the number corresponds to the sampling control signal.

25. The semiconductor device of claim 5, wherein the plurality of shifters are a number of synchronizers, wherein the number corresponds to a burst length.

26. The semiconductor device of claim 1, wherein the internal clock signal is generated by delaying the reference clock signal for a time corresponding to the delay control signal and the feedback clock signal is generated by reflecting a delay of a clock path in the semiconductor device at the internal clock signal.

27. A latency signal generating circuit, comprising:
- a selection output circuit configured to receive a read command signal and locking completion information and, depending on whether the latency signal generating circuit is operating in a normal mode or a delay measurement mode, selectively output the read command signal and the locking completion information in synchronization with an external clock signal;
- a variable delay circuit configured to receive a delay control signal and delay an output signal of the selection output unit for a period of time corresponding to the delay control signal, wherein the delay control signal is determined in response to a phase difference between a reference clock signal and a feedback clock signal;
- a delay time measuring circuit configured to generate the measured delay value by measuring a delay time through the variable delay unit; and
- a latency signal output circuit configured to receive a column address strobe (CAS) latency value and, in response to the measured delay value and the CAS latency value, output the latency signal by synchronizing an output signal of the variable delay unit with the internal clock signal.

28. The latency signal generating circuit of claim 27, wherein the normal mode is a mode for performing a read operation in response to the read command signal after locking operation and the delay measurement mode is a mode for generating the measured delay value after the locking operation.

29. The latency signal generating circuit of claim 27, wherein the selection output circuit includes:
- a read command signal synchronizer configured to output the read command signal in synchronization with the external clock signal in the normal mode;
- a locking completion signal synchronizer configured to output a locking completion signal in synchronization with the external clock signal during the delay measurement mode; and
- a multiplexer configured to selectively output one of an output signal of the read command signal synchronizer and an output signal of the locking completion signal synchronizer depending on whether the latency signal generating circuit is operating in the normal mode or the delay measurement mode.

30. The latency signal generating circuit of claim 29, wherein the locking completion signal synchronizer includes:
- a synchronizing unit configured to synchronize the locking completion signal with the external clock signal and output the synchronized signal as a synchronized locking completion signal; and
- a pulse signal generating unit configured to generate a delay measurement pulse signal having a predetermined pulse width, wherein the pulse width is determined in response to the synchronized locking completion signal.

31. The latency signal generating circuit of claim 30, wherein the delay time measuring circuit includes:
- a first delay replica model configured to delay an output signal of the variable delay circuit for a period of time equal to a delay through another delay replica model; and
- a measured delay value generator configured to generate the measured delay value by counting a counting clock signal in response to the synchronized locking completion signal and an output signal of the first delay replica model.

32. The latency signal generating circuit of claim 31, wherein the measured delay value generator includes:
- a mode signal generating unit configured to generate a mode selection signal in response to the synchronized locking completion signal; and a measured delay value counting unit configured to count the counting clock signal during a period defined by the synchronized locking completion information and the mode selection signal.

33. The latency signal generating circuit of claim 32, wherein the mode selection signal maintains a set state in response to the synchronized locking completion signal.

34. The latency signal generating circuit of claim 32, wherein the measured delay value counting unit includes:
- a measurement activation signal generating unit configured to generate a measurement activation signal in response to the synchronized locking completion signal and the mode selection signal;
- a sampling clock generating unit configured to generate a sampling clock signal by sampling the counting clock signal in response to the measurement activation signal; and
- a counting unit configured to count the sampling clock signal and output the count.

35. The latency signal generating circuit of claim 27, wherein the latency signal output circuit includes:
- a signal input unit configured to receive an output signal of the variable delay circuit in the normal mode;
- a plurality of shifters configured to shift an output signal of the signal input unit in response to the internal clock signal; and
- a latency signal controller configured to output one of output signals of the plurality of shifters as the latency signal in response to the CAS latency value and the measured delay value.

36. The latency signal generating circuit of claim 35, wherein the latency signal controller includes:
- a calculating unit configured to output a selection signal by calculating the CAS latency value and the measured delay value; and
- a selection output unit configured to output one of the output signals of the plurality of shifters in response to the selection signal.

37. The latency signal generating circuit of claim 35, wherein the latency signal is one selected among the output signals of the plurality of shifters before the read command signal is activated and the latency signal is activated in response to the read command signal.

38. The latency signal generating circuit of claim 27, further comprising:
- a control signal sampling circuit configured to generate a sampling control signal for controlling the variable delay circuit by sampling the delay control signal.

39. The latency signal generating circuit of claim 38, wherein the control signal sampling circuit includes:
- an encoder configured to encode the delay control signal; and
- a decoder configured to generate the sampling control signal by decoding an output signal of the encoder.

40. The latency signal generating circuit of claim 38, wherein the variable delay circuit includes a number of unit delay cells, wherein the number corresponds to the sampling control signal.

* * * * *